(12) United States Patent
Fujimori

(10) Patent No.: US 10,644,225 B2
(45) Date of Patent: May 5, 2020

(54) MAGNETIC MEMORY DEVICE

(71) Applicant: TOSHIBA MEMORY CORPORATION, Minato-ku, Tokyo (JP)

(72) Inventor: Takeshi Fujimori, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,744

(22) Filed: Sep. 12, 2017

(65) Prior Publication Data

US 2018/0006212 A1 Jan. 4, 2018

Related U.S. Application Data

(63) Continuation of application No. PCT/IB2015/055804, filed on Jul. 31, 2015.
(Continued)

(51) Int. Cl.
*H01L 43/02* (2006.01)
*H01L 23/552* (2006.01)
(Continued)

(52) U.S. Cl.
CPC ............ *H01L 43/02* (2013.01); *H01L 23/552* (2013.01); *H01L 43/08* (2013.01); *G11C 11/15* (2013.01); *G11C 11/161* (2013.01); *H01L 23/3128* (2013.01); *H01L 24/06* (2013.01); *H01L 24/32* (2013.01); *H01L 24/48* (2013.01); *H01L 24/49* (2013.01); *H01L 24/73* (2013.01);
(Continued)

(58) Field of Classification Search
CPC ....... H01L 43/02; H01L 23/55; H01L 23/552; H01L 43/08; H01L 27/228; H01L 23/00
USPC .................................................. 257/421, 422
See application file for complete search history.

(56) References Cited

U.S. PATENT DOCUMENTS 5,440,169 A * 8/1995 Tomita ................ H01L 23/3107
257/667
5,902,690 A * 5/1999 Tracy ...................... G11C 11/15
257/E27.005
(Continued)

FOREIGN PATENT DOCUMENTS

JP 02026198 U 2/1990
JP 05120865 A 5/1993
(Continued)

OTHER PUBLICATIONS

English transaltion of FP: JP-2011114225-A , Jun. 9, 2011.*
(Continued)

*Primary Examiner* — Sheikh Maruf
(74) *Attorney, Agent, or Firm* — Holtz, Holtz & Volek PC

(57) ABSTRACT

According to one embodiment, a magnetic memory device includes a magnetic memory chip having a magnetoresistive element, a magnetic layer having first and second portions spacing out each other, the first portion covering a first main surface of the magnetic memory chip, the second portion covering a second main surface facing the first main surface of the magnetic memory chip, a circuit board on which the magnetic layer is mounted, and a bonding wire connecting between the magnetic memory chip and the circuit board in a first direction parallel to the first and second main surfaces.

9 Claims, 21 Drawing Sheets

Related U.S. Application Data

(60) Provisional application No. 62/153,267, filed on Apr. 27, 2015.

(51) Int. Cl.

| | | |
|---|---|---|
| *H01L 43/08* | (2006.01) | |
| *G11C 11/16* | (2006.01) | |
| *H01L 23/31* | (2006.01) | |
| *H01L 23/00* | (2006.01) | |
| *H01L 27/22* | (2006.01) | |
| *G11C 11/15* | (2006.01) | |
| *H01L 25/065* | (2006.01) | |

(52) U.S. Cl.
CPC .......... *H01L 24/92* (2013.01); *H01L 25/0657* (2013.01); *H01L 27/228* (2013.01); *H01L 2224/04042* (2013.01); *H01L 2224/06135* (2013.01); *H01L 2224/32145* (2013.01); *H01L 2224/32245* (2013.01); *H01L 2224/48091* (2013.01); *H01L 2224/48106* (2013.01); *H01L 2224/48227* (2013.01); *H01L 2224/49175* (2013.01); *H01L 2224/73215* (2013.01); *H01L 2224/73265* (2013.01); *H01L 2224/92165* (2013.01); *H01L 2225/0651* (2013.01); *H01L 2225/06537* (2013.01); *H01L 2225/06575* (2013.01); *H01L 2924/00014* (2013.01); *H01L 2924/1434* (2013.01); *H01L 2924/1443* (2013.01); *H01L 2924/15311* (2013.01); *H01L 2924/181* (2013.01)

(56) References Cited

U.S. PATENT DOCUMENTS

| | | | | |
|---|---|---|---|---|
| 6,838,740 | B2* | 1/2005 | Huai | B82Y 25/00 257/295 |
| 6,916,668 | B2* | 7/2005 | Spielberger | B82Y 10/00 257/659 |
| 6,943,993 | B2* | 9/2005 | Chang | B82Y 10/00 360/319 |
| 6,972,992 | B1* | 12/2005 | Fukuzumi | B82Y 25/00 257/E43.004 |
| 9,576,636 | B1* | 2/2017 | Slaughter | G11C 11/1675 |
| 9,653,182 | B1* | 5/2017 | Toko | H01L 27/228 |
| 9,893,020 | B2* | 2/2018 | Lee | H01L 23/552 |
| 9,990,976 | B1* | 6/2018 | Slaughter | G11C 11/1675 |
| 2001/0021089 | A1* | 9/2001 | Miyauchi | B82Y 10/00 360/324.2 |
| 2002/0003684 | A1* | 1/2002 | Nakashio | B82Y 10/00 360/324.2 |
| 2002/0050632 | A1* | 5/2002 | Tuttle | H01L 23/552 257/678 |
| 2002/0145902 | A1* | 10/2002 | Kunikiyo | B82Y 10/00 365/97 |
| 2003/0099069 | A1* | 5/2003 | Kagami | B82Y 10/00 360/313 |
| 2003/0161181 | A1* | 8/2003 | Saito | G11C 11/16 365/173 |
| 2005/0207263 | A1* | 9/2005 | Okayama | G11C 11/16 365/232 |
| 2005/0219767 | A1* | 10/2005 | Nakamura | G11B 5/39 360/324.1 |
| 2006/0017082 | A1* | 1/2006 | Fukuzumi | B82Y 25/00 257/295 |
| 2007/0241410 | A1* | 10/2007 | Umehara | B82Y 10/00 257/379 |
| 2008/0122047 | A1* | 5/2008 | Honer | H01L 23/552 257/660 |
| 2008/0247072 | A1* | 10/2008 | Nozieres | G11C 11/16 360/59 |
| 2009/0039329 | A1* | 2/2009 | Hofmann | H01L 27/2436 257/2 |
| 2009/0045488 | A1* | 2/2009 | Chang | H01L 23/552 257/659 |
| 2009/0273965 | A1* | 11/2009 | Takenaga | B82Y 25/00 365/158 |
| 2010/0072566 | A1* | 3/2010 | Kang | H01L 43/08 257/422 |
| 2010/0164077 | A1* | 7/2010 | Bando | H01L 23/49503 257/659 |
| 2010/0220516 | A1* | 9/2010 | Lee | G11C 11/16 365/158 |
| 2010/0237449 | A1* | 9/2010 | Fukami | G11C 19/0808 257/421 |
| 2010/0254182 | A1* | 10/2010 | Kuroiwa | G11C 11/1675 365/158 |
| 2011/0102948 | A1* | 5/2011 | Apalkov | G11C 11/1659 360/324.2 |
| 2011/0241140 | A1* | 10/2011 | Tsujiuchi | H01L 27/228 257/421 |
| 2012/0205764 | A1* | 8/2012 | Chen | G11C 11/16 257/422 |
| 2012/0211846 | A1* | 8/2012 | Li | H01L 23/552 257/421 |
| 2012/0293170 | A1* | 11/2012 | Nakajima | B82Y 25/00 324/252 |
| 2012/0309131 | A1* | 12/2012 | Bando | H01L 23/49503 438/118 |
| 2013/0069184 | A1* | 3/2013 | Aikawa | H01L 43/08 257/421 |
| 2013/0249024 | A1* | 9/2013 | Saida | H01L 43/08 257/421 |
| 2013/0256819 | A1* | 10/2013 | Watanabe | H01L 43/02 257/422 |
| 2013/0285176 | A1 | 10/2013 | Suzuki et al. | |
| 2014/0008742 | A1* | 1/2014 | Chen | G01R 33/098 257/421 |
| 2014/0015077 | A1* | 1/2014 | Lee | H01L 43/02 257/421 |
| 2014/0015078 | A1* | 1/2014 | Huai | B82Y 25/00 257/421 |
| 2014/0042568 | A1* | 2/2014 | Yamakawa | H01L 43/02 257/421 |
| 2014/0085968 | A1* | 3/2014 | Saida | G11C 11/161 365/158 |
| 2014/0110804 | A1* | 4/2014 | Han | H01L 43/08 257/421 |
| 2014/0197505 | A1* | 7/2014 | Zhou | H01L 23/552 257/422 |
| 2014/0269035 | A1* | 9/2014 | Manipatruni | G11C 11/1675 365/158 |
| 2015/0008547 | A1* | 1/2015 | Pi | H01L 43/04 257/421 |
| 2015/0008548 | A1 | 1/2015 | Noma | |
| 2015/0069545 | A1* | 3/2015 | Noma | H01L 23/552 257/421 |
| 2015/0069546 | A1 | 3/2015 | Kobayashi et al. | |
| 2015/0084141 | A1* | 3/2015 | Fujimori | H01L 23/552 257/421 |
| 2015/0091109 | A1* | 4/2015 | Allinger | H01L 23/552 257/421 |
| 2016/0155706 | A1* | 6/2016 | Yoneyama | H01L 23/24 257/77 |
| 2016/0322562 | A1* | 11/2016 | Jang | H01L 43/08 |

FOREIGN PATENT DOCUMENTS

| | | | |
|---|---|---|---|
| JP | 2004207322 A | | 7/2004 |
| JP | 2005158985 A | | 6/2005 |
| JP | 2011114225 A | * | 6/2011 |
| JP | 2011114225 A | | 6/2011 |
| JP | 2015053450 A | | 3/2015 |
| JP | 2015065223 A | | 4/2015 |

(56) References Cited

OTHER PUBLICATIONS

International Search Report (ISR) and Written Opinion dated Nov. 2, 2015 issued in International Application No. PCT/IB2015/055804.

* cited by examiner

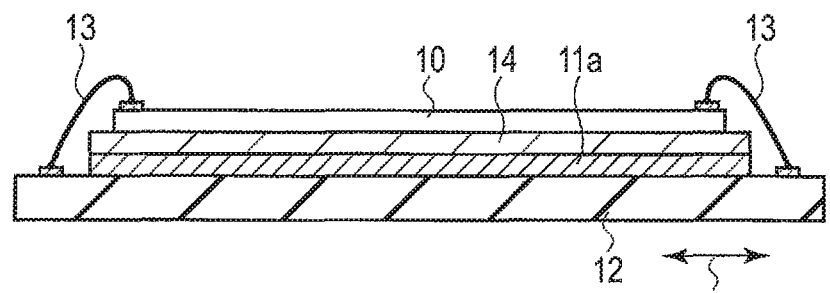
F I G. 13A
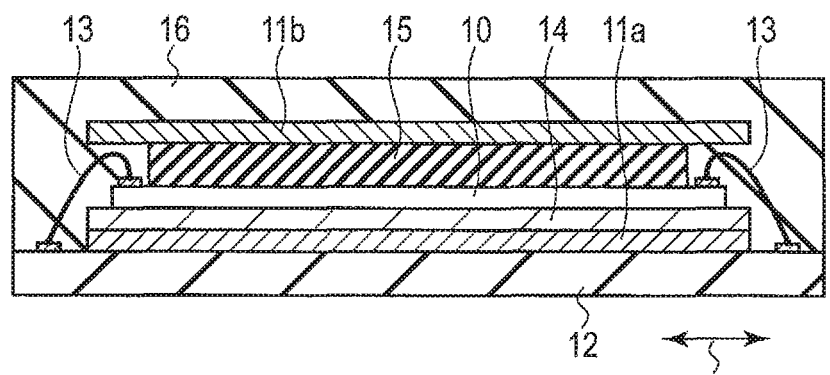
F I G. 13B
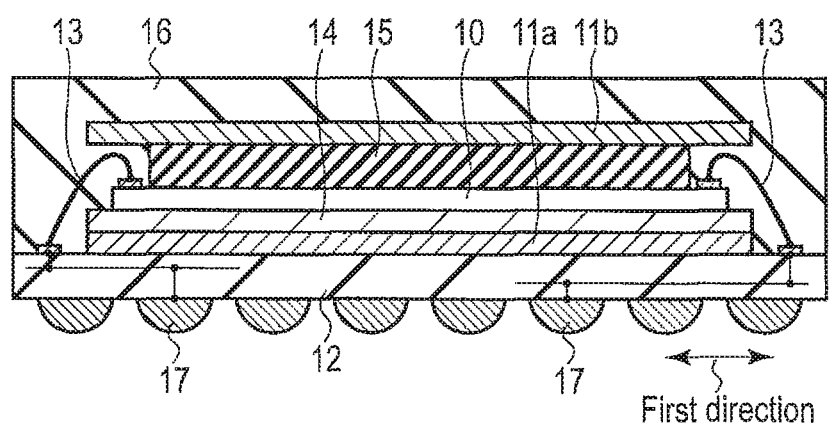
F I G. 13C

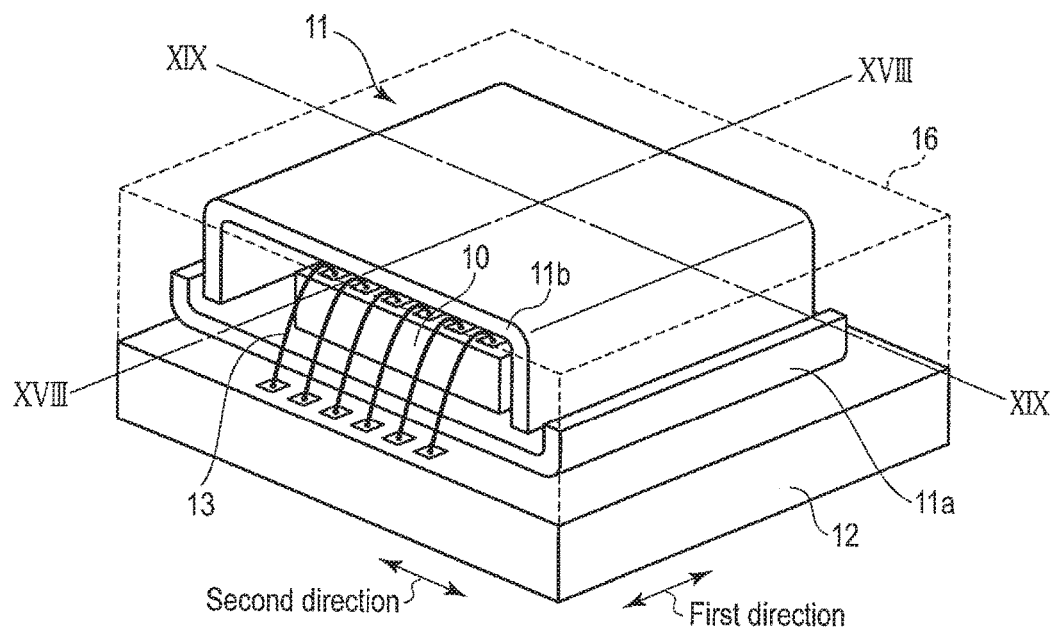
F I G. 17
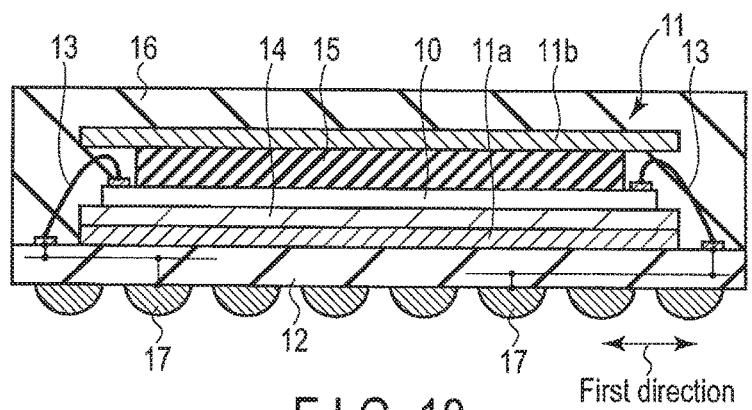
F I G. 18
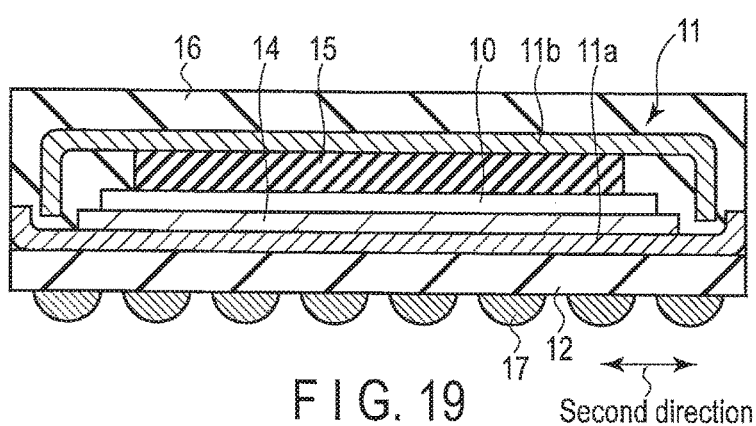
F I G. 19

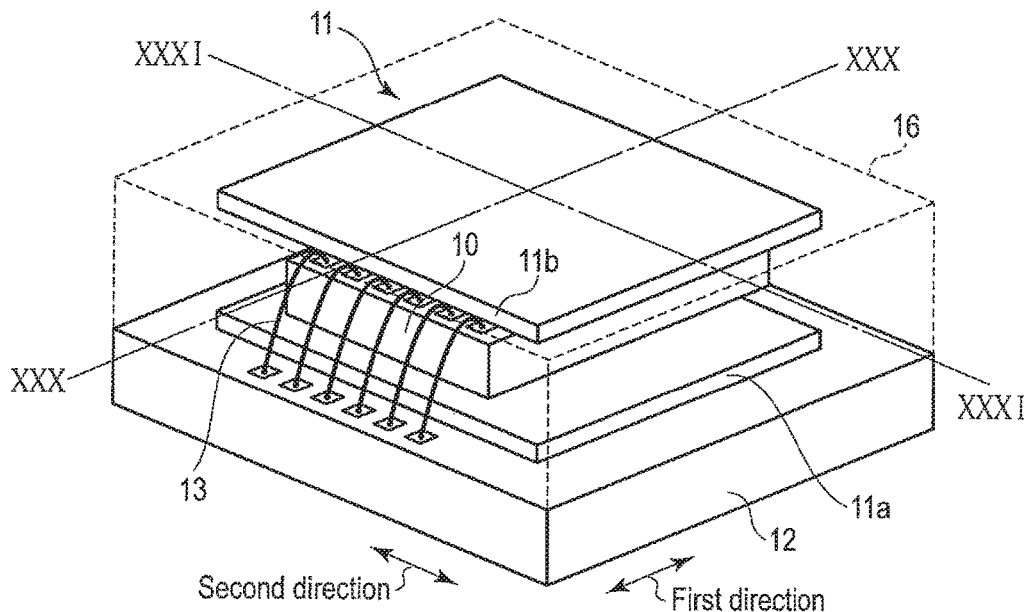
F I G. 29
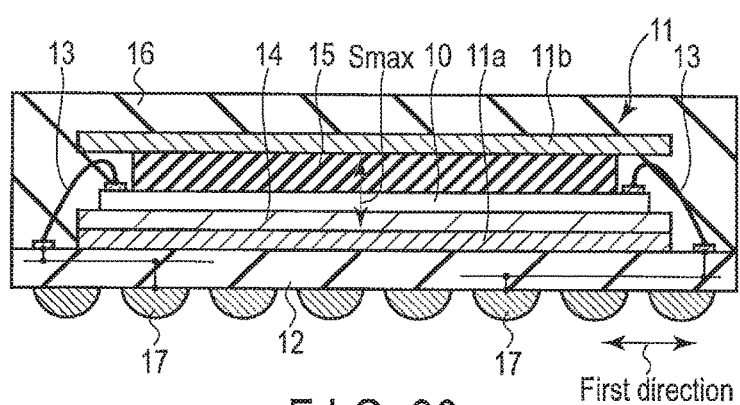
F I G. 30
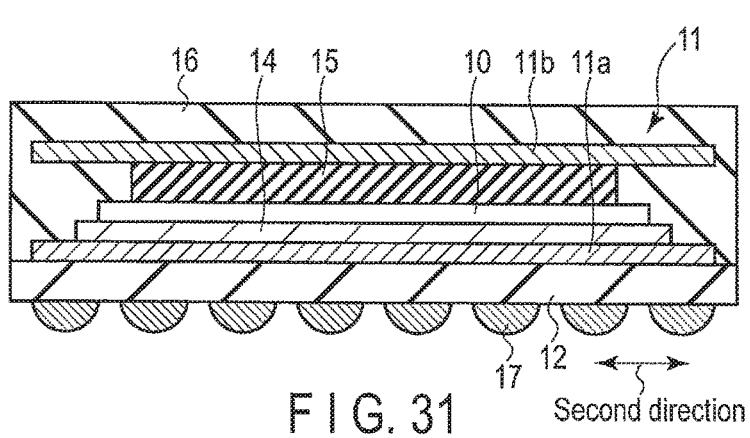
F I G. 31

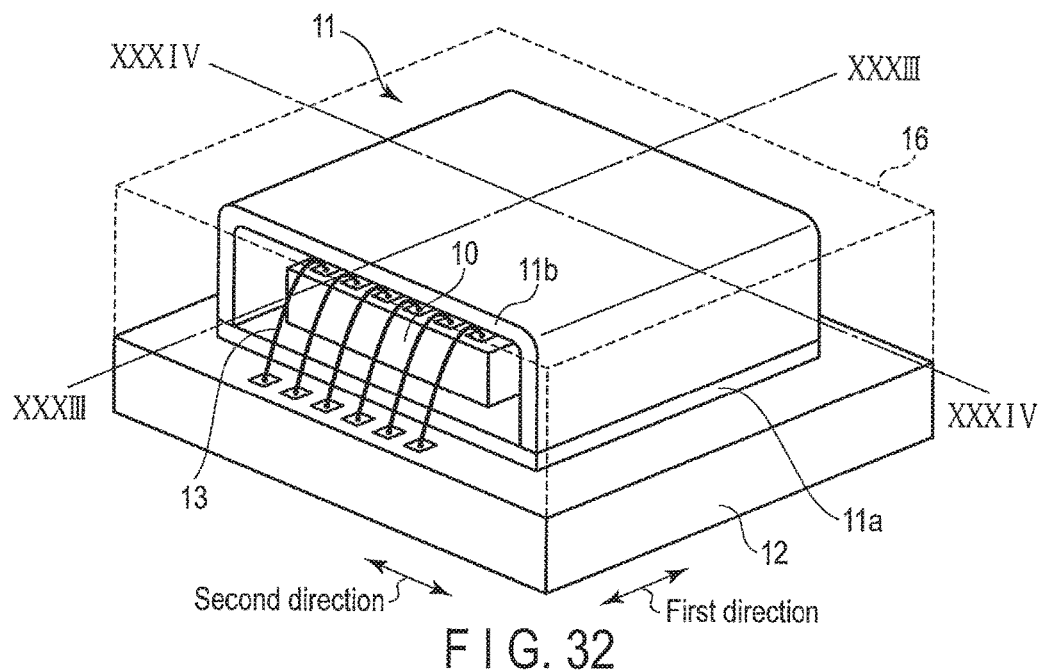
F I G. 32
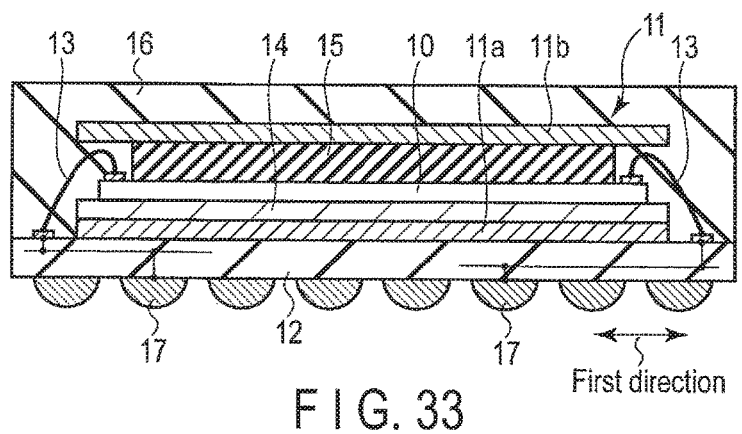
F I G. 33
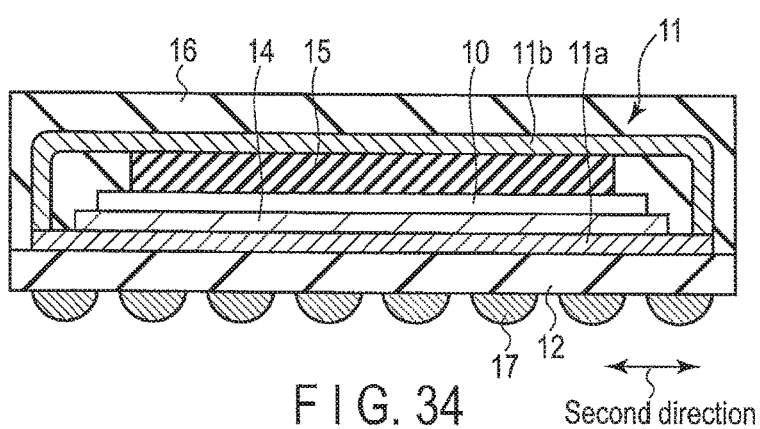
F I G. 34

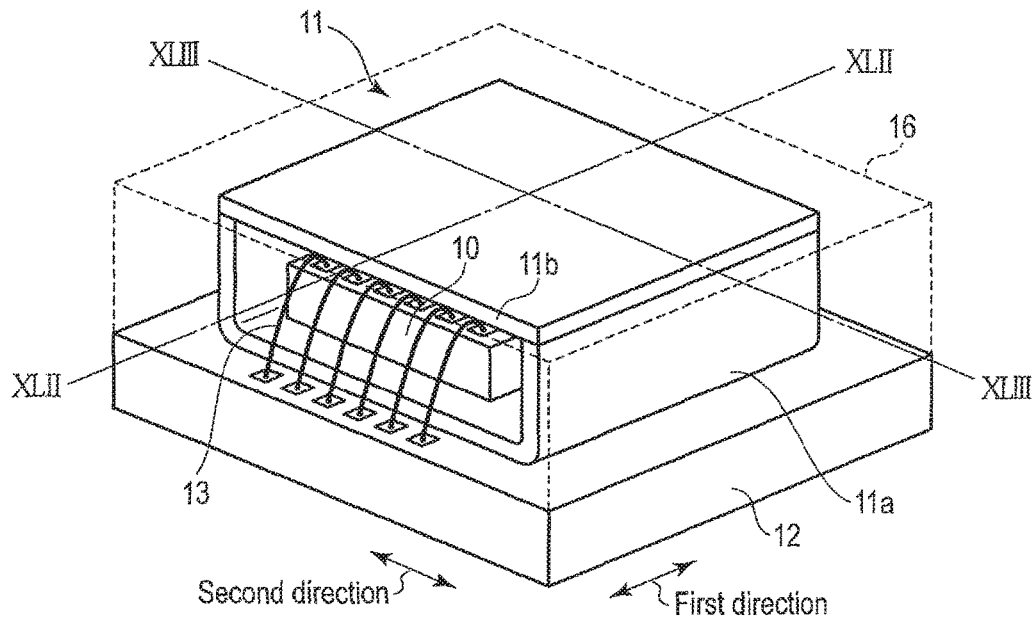
F I G. 41
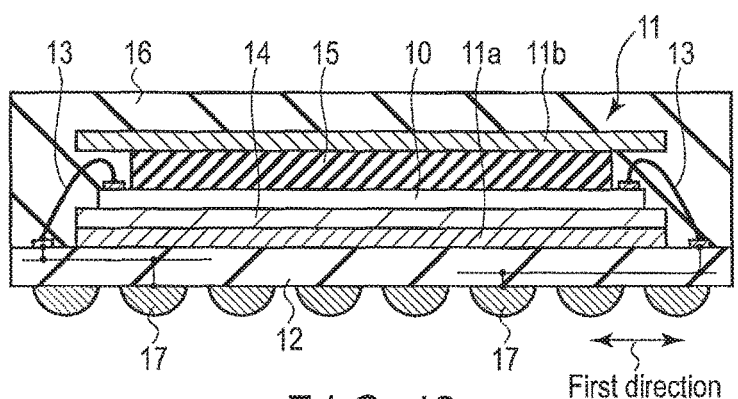
F I G. 42
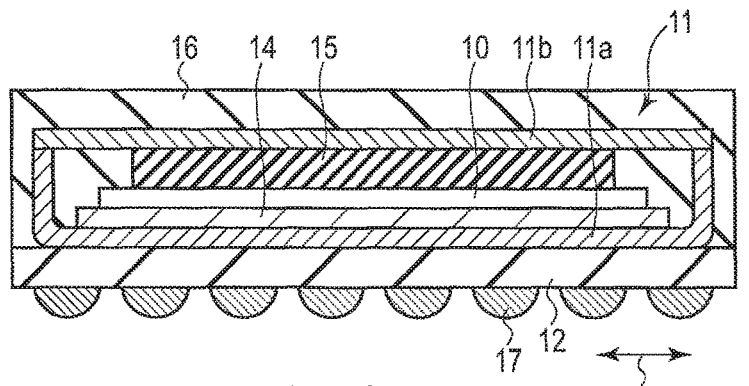
F I G. 43

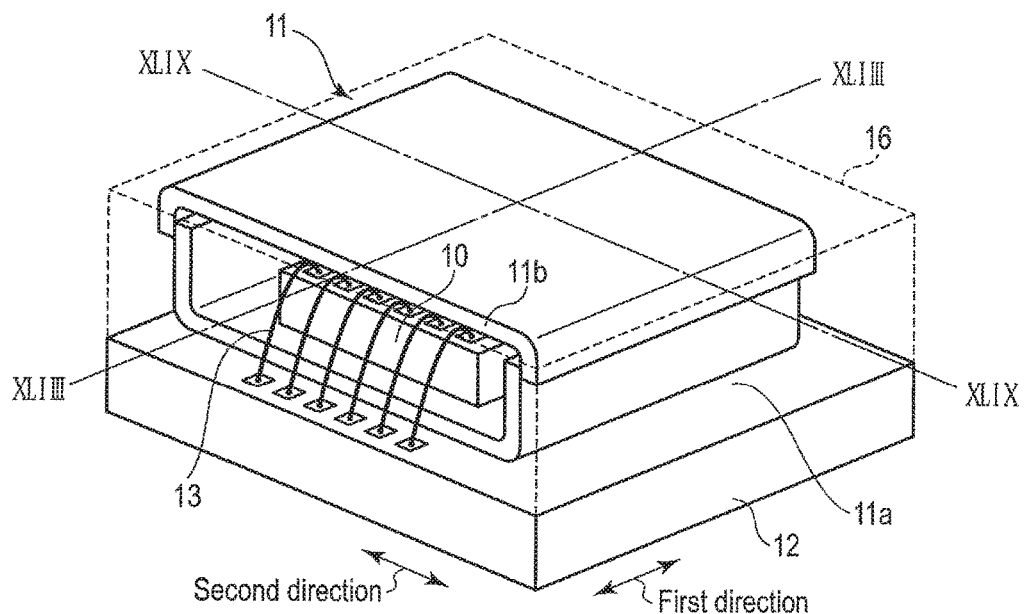
F I G. 47
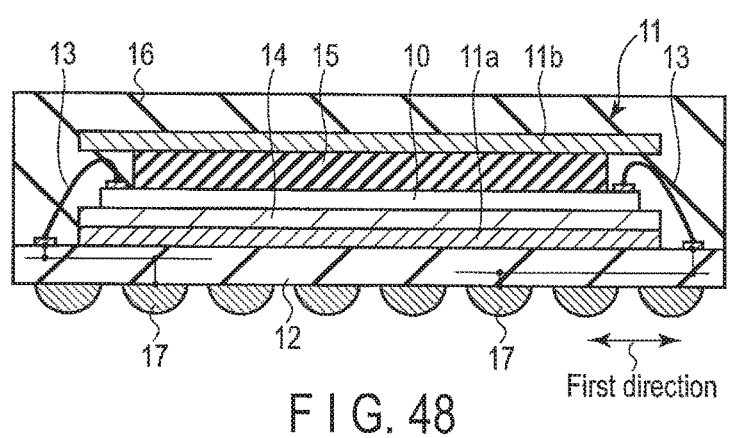
F I G. 48
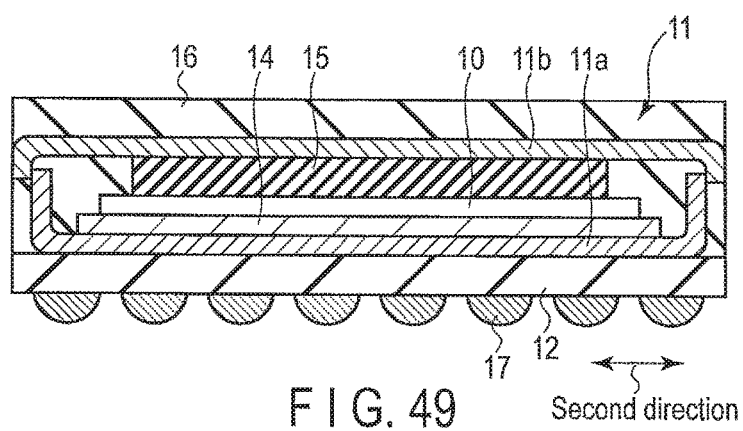
F I G. 49

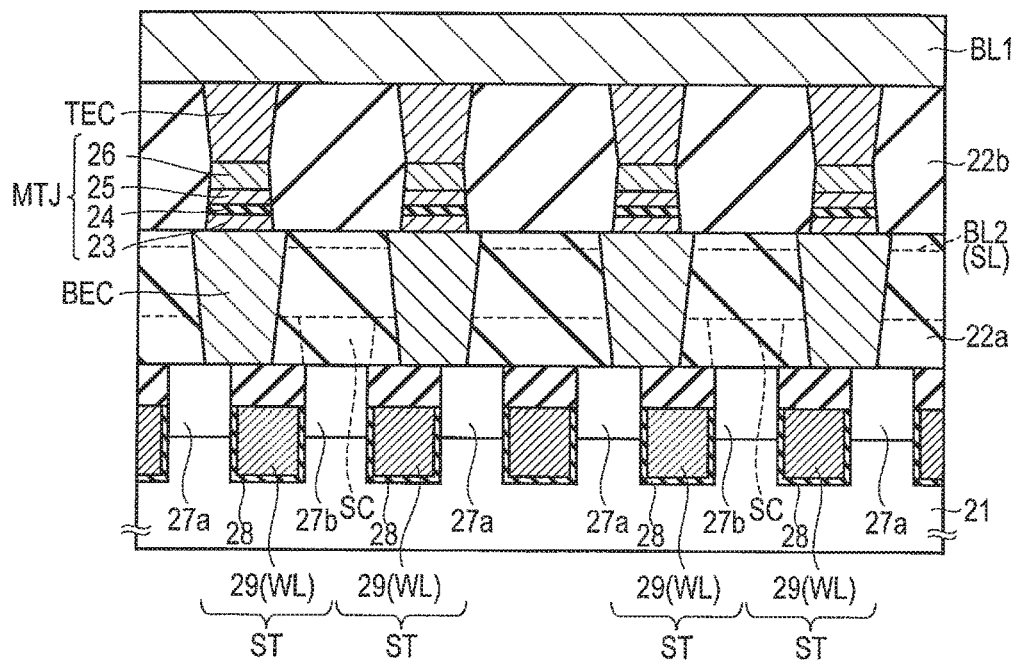
F I G. 55
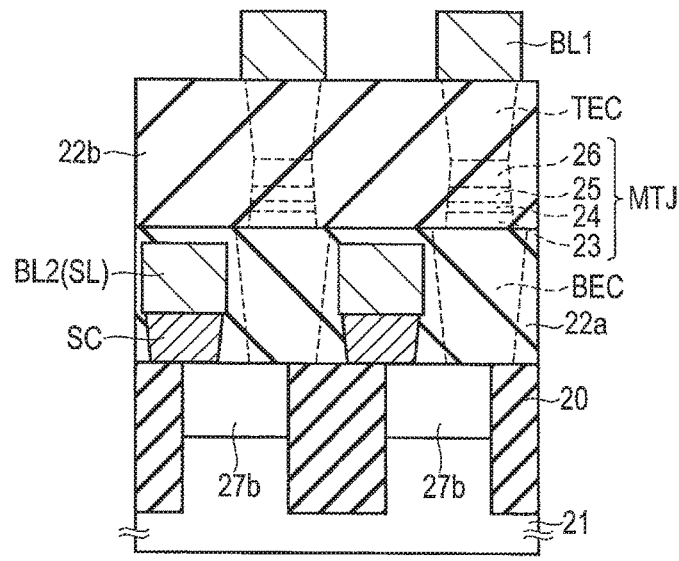
F I G. 56

MAGNETIC MEMORY DEVICE

CROSS-REFERENCE TO RELATED APPLICATIONS

This application is a Continuation Application of PCT Application No. PCT/IB2015/055804, field Jul. 31, 2015 and based upon and claiming the benefit of priority from U.S. Provisional Application No. 62/153,267, filed Apr. 21, 2015, the entire contents of all of which are incorporated herein by reference.

FIELD

Embodiments described herein relate generally to a magnetic memory device.

BACKGROUND

A magnetic memory device comprises a magnetic memory chip including a plurality of magnetoresistive elements and a magnetic layer (magnetic shield layer) having a closed loop structure in which in a cross section of the magnetic memory chip, the magnetic layer continuously surrounds the magnetic memory chip.

The magnetic layer having the closed loop structure shields the magnetic memory chip from an external magnetic field or adjusts a magnetization reversal characteristic (hysteresis characteristic) of each of the magnetoresistive elements. For example, in the case where a magnet is provided in the magnetic layer having the closed loop structure, magnetic lines of force from the magnet make a loop passing through the magnetic layer having the closed loop structure. Thus, the nonuniform of a magnetic field applied to the magnetoresistive elements can be reduced. Therefore, the shift of the magnetization reversal characteristics of the magnetoresistive elements can be canceled by the magnetic fields, thus improving the function of the magnetic memory device.

BRIEF DESCRIPTION OF THE DRAWINGS

FIGS. 13A, 13B and 13C are cross-sectional views showing a method for manufacturing the magnetic memory device;

FIG. 17 is a perspective view showing a third embodiment of the magnetic memory device;

FIG. 18 is a cross-sectional view taken along line XVIII-XVIII in FIG. 17;

FIG. 19 is a cross-sectional view taken along line XIX-XIX in FIG. 17;

FIG. 29 is a perspective view showing a seventh embodiment of the magnetic memory device;

FIG. 30 is a cross-sectional view taken along line XXX-XXX in FIG. 29;

FIG. 31 is a cross-sectional view taken along line XXXI-XXXI in FIG. 1;

FIG. 32 is a perspective view showing an eighth embodiment of the magnetic memory device;

FIG. 33 is a cross-sectional view taken along line XXXIII-XXXIII in FIG. 32;

FIG. 34 is a cross-sectional view taken along line XXXIV-XXXIV in FIG. 32;

FIG. 41 is a perspective view showing an eleventh embodiment of the magnetic memory device;

FIG. 42 is a cross-sectional view taken along line XLII-XLII in FIG. 41;

FIG. 43 is a cross-sectional view taken along line XLIII-XLIII in FIG. 41;

FIG. 47 is a perspective view showing a thirteenth embodiment of the magnetic memory device;

FIG. 48 is a cross-sectional view taken along line XLVIII-XLVIII in FIG. 47;

FIG. 49 is a cross-sectional view taken along line XLIX-XLIX in FIG. 47;

FIG. 55 is a cross-sectional view taken along line LV-LV in FIG. 54;

FIG. 56 is a cross-sectional view taken along line LVI-LVI in FIG. 54.

DETAILED DESCRIPTION

Figure 1:
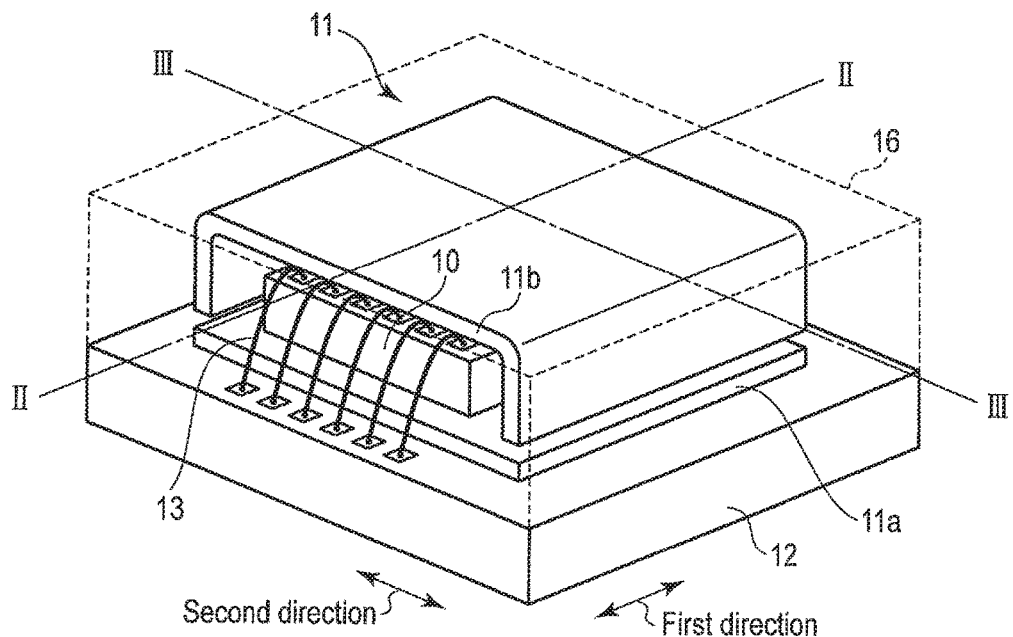
FIG. 1 is a perspective view showing a first embodiment of a magnetic memory device.

In general, according to one embodiment, a magnetic memory device comprises: a magnetic memory chip having a magnetoresistive element; a magnetic layer having first and second portions spacing out each other, the first portion covering a first main surface of the magnetic memory chip, the second portion covering a second main surface facing the first main surface of the magnetic memory chip; a circuit board on which the magnetic layer is mounted; and a bonding wire connecting between the magnetic memory chip and the circuit board in a first direction parallel to the first and second main surfaces. The first portion is nearer the circuit board than the second portion. Each of the first and second portions has a size larger than a size of the magnetic memory chip in the first direction. One of the first and second portions covers side surfaces of the magnetic memory chip in a second direction parallel to the first and second main surfaces and orthogonal to the first direction. The first portion is nearer the circuit board than the second portion. Each of the first and second portions has a size larger than a size of the magnetic memory chip in the first direction. One of the first and second portions covers side surfaces of the magnetic memory chip in a second direction parallel to the first and second main surfaces and orthogonal to the first direction.

(Embodiments)

The embodiments described herein propose a technique of controlling the intensity of a magnetic field applied to magnetoresistive elements with a magnetic layer (magnetic shield layer) surrounding a magnetic memory chip.

For example, in the cross section of any part of the magnetic memory chip, space is provided in the magnetic layer surrounding the magnetic memory chip such that this surrounding is discontinuous because of provision of the space. Such a magnetic layer is referred to as a magnetic layer having an open loop structure. Furthermore, in a cross section of the magnetic memory chip, the width of the space provided in the magnetic layer having the open loop structure can be controlled.

In this case, some of magnetic lines of force from a magnet, in the magnetic layer having the open loop structure are radiated from, for example, the space in provided in the magnetic layer to the outside. That is, by controlling the width of the above space, it is possible to control the intensity of the magnetic field applied to the magnetoresistive elements.

Therefore, it is possible to control the shift of the magnetization reversal characteristics of the magnetoresistive elements and improve the function of the magnetic memory device without changing, for example, the kind or size of the magnet provided in the magnetic layer.

It should be noted that in the embodiments described herein, the magnetic layer having the open loop structure includes at least two parts (first and second parts) in order to control the space of the magnetic layer. To be more specific, it is possible to control the intensity of the magnetic field applied to the magnetoresistive elements by controlling the width of the space provided at ends of the first and second parts.

First Embodiment

Figure 2:
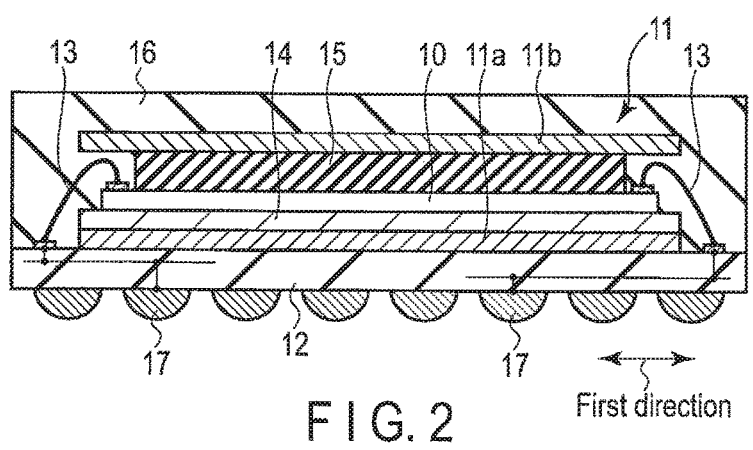
FIG. 2 is a cross-sectional view taken along line II-II in FIG. 1.
Figure 3:
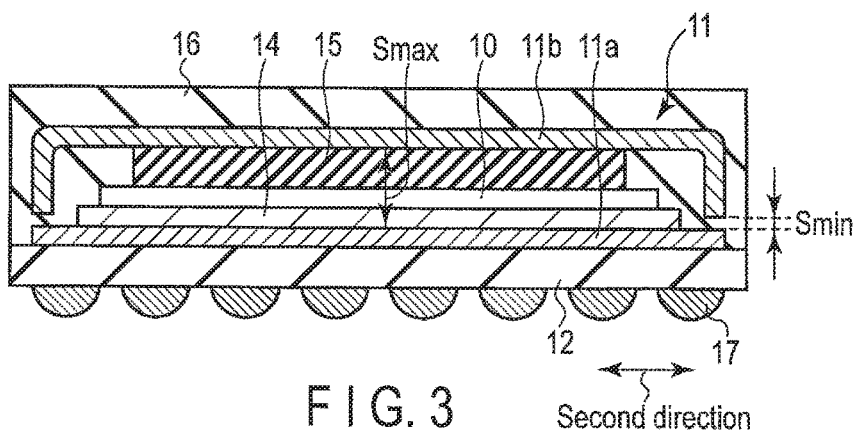
FIG. 3 is a cross-sectional view taken along line III-III in FIG. 1.

FIGS. 1-3 show the first embodiment of a magnetic memory device. FIG. 1 is a perspective view of the magnetic memory device, FIG. 2 is a cross-sectional view taken along line II-II in FIG. 1, and FIG. 3 is a cross-sectional view taken along line III-III in FIG. 1.

A magnetic memory chip 10 comprises magnetoresistive elements serving as memory cells. The magnetoresistive elements, for example, as shown in FIG. 12, each comprise a storage layer (magnetic layer) 23 having variable magnetization, a reference layer (magnetic layer) 25 having invariable magnetization, and a nonmagnetic insulating layer (tunnel barrier layer) 24.

It should be noted that the invariable magnetization means that the magnetization direction is invariable before and after writing, and the variable magnetization means that the magnetization is variable opposite before and after writing.

Furthermore, the writing means spin transfer writing in which a spin implantation current (spin-polarized elections) is made to flow into magnetoresistive elements to give a spin torque to the storage layer.

Figure 12:
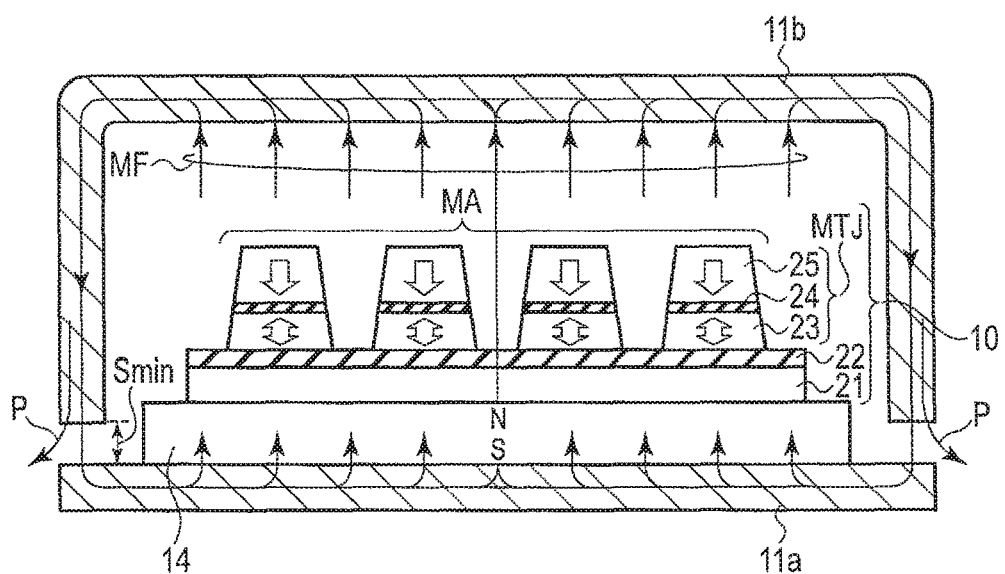
FIG. 12 is a cross-sectional view showing magnetic lines of force in the first embodiment.

An example shown in FIG. 12 is of a top-pin type in which reference layers 25 are provided on storage layers 23. It can be replaced by a bottom-pin type in which reference layers 25 are provided under storage layers 23.

Also, the example of FIG. 12 is of a perpendicular magnetization type in which the storage layers 23 and the reference layers 25 have magnetization in a direction perpendicular to the lower surface (first main surface) and upper surface (second main surface) of the magnetic memory chip 10. This perpendicular magnetization type can be replaced by an in-plane magnetization type in which storage layers 23 and reference layers 25 have magnetization in a direction parallel with the lower and upper surfaces of the magnetic memory chip 10.

The magnetic layer 11 comprises a first part 11*a* and a second part 11*b* which are provided, with space provided between those parts. That is, the magnetic layer 11 has an open loop structure in which it is divided by the space into the above parts. The magnetic layer 11 is provided on a circuit board 12.

The circuit board 12 is, for example, a multi-layer board provided with a plurality of wiring layers. The circuit board 12 includes a plurality of external terminals 17. The external terminals 17 are, for example, solder balls applied as a ball grid array (BGA).

The first part 11*a* is located closer to the circuit board 12 than the second part 11*b*. To be more specific, the first part 11*a* is provided on the circuit board 12, and covers the lower surface (first main surface) of the magnetic memory chip 10. The second part 11*b* covers the upper surface (the second surface located opposite to the first surface) of the magnetic memory chip 10.

In a first direction parallel to the lower surface and upper surface of the magnetic memory chip 10, bonding wires 13 connect the magnetic memory chip 10 and the circuit board 12. The magnetic memory chip 10 is connected to the external terminals 17 by the bonding wires 13.

A spacer (e.g., an insulator) 15 is provided between the magnetic memory chip 10 and the second part 11b. Furthermore, in the first direction, the first and second parts 11a and 11b do not cover two side surfaces of the magnetic memory chip 10.

Thereby, in the first direction, the first parts 11a and 11b can be made larger in size than the magnetic memory chip 10, and an area for connecting the bonding wires 13 to the magnetic memory chip 10 can also be ensured.

Also, the direction parallel to the lower surface and upper surface of the magnetic memory chip 10 and perpendicular to the first direction is defined as a second direction. In the first and second directions, since the first part 11a and the second part 11b are made larger in size than the magnetic memory chip 10, it is possible to prevent disturbance of a magnetic field in the vicinity of an edge of the magnetic memory chip 10.

It is therefore possible to apply a stable magnetic field to the magnetic elements, which are provided in the vicinity of the magnetic memory chip 10.

In order to effectively prevent disturbance of the magnetic field in the vicinity of the edge of the magnetic memory chip 10, it is preferable that in the first and second directions, the first part 11a and the second part 11b have a size which is equal to or greater than 120% of the size of the magnetic memory chip 10. That is, it is preferable that from both sides of the magnetic memory chip 10, the first part 11a and the second part 11b be projected by a distance equal to or greater than 10% of the size of the magnetic memory chip 10.

For example, in the first and second directions, if the size of the magnetic memory chip 10 is approximately 10 mm, it is preferable that the sizes of the first part 11a and the second part 11b be equal to or greater than 12 mm.

A permanent magnet 14 is provided adjacent to the lower surface of the magnetic memory chip 10. That is, the permanent magnet 14 is provided between the magnetic memory chip 10 and the first part 11a. The permanent magnet 14 is provided to, for example, cancel the shift of the magnetic reversal characteristics of the magnetoresistive elements. Therefore, if it is not necessary that the shift of the magnetization reversal characteristics is canceled by the permanent magnet 14, the permanent magnet 14 may be omitted.

Resin 16 is provided on the circuit board 12, and covers the magnetic memory chip 10, the magnetic layer 11 having the first part 11a and the second part 11b, the bonding wires 13 and the permanent magnet 14 and the spacer 15.

The open loop structure of the magnetic layer 11 will be explained.

In the second direction, the second part 11b covers two side surfaces of the magnetic memory chip 10. To be more specific, the first part 11a, which is located below the magnetic memory chip 10, is formed in the shape of a plate, and the second part 11b, which is located above the magnetic memory chip 10, is inverted U-shaped.

Furthermore, in the second direction, the first part 11a and the second part 11b each include first and second ends, and with respect to the space between the first and second parts, the space between the first ends and the second ends is the narrowest. The narrowest space is Smin.

By controlling the width Smin of the space of the open loop structure, it is possible to shield the magnetic memory chip 10 from an external magnetic field, and also control the intensity of the magnetic field applied to the magnetoresistive elements to control the magnetization reversal characteristics of the magnetoresistive elements.

It is preferable that the width Smin of the space of the open loop structure be equal to or smaller than ½ of the maximum value Srnax of the space between the first and second parts. Also, it is preferable that the width Smin of the space of the open loop structure is close to or greater than tchip, where tchip is the thickness of the magnetic memory chip 10. For example, if the thickness of the magnetic memory chip 10 is approximately 0.1 mm, it is preferable that the width Smin of the space of the open loop structure fall within the range of 0.05 to 0.3 mm, for example, it be approximately 0.15 mm.

Examples of materials will be explained.

It is preferable that the magnetic layer 11, i.e., the first part 11a and the second part 11b, be formed of material having high magnetic permeability and magnetic permeability and high saturation magnetization. For example, it is preferable that the magnetic layer 11 contain Ni, Fe, Co, a Ni—Fe alloy, a Fe—Co alloy, Fe2O4 or the like. If the magnetic layer 11 contains Fe2O4, Mn, Zn, Ni or the like may be added to Fe2O4. To the magnetic layer 11, a 42 alloy, a permalloy or the like can be applied.

The first part 11a and the second part 11b may be formed of the same material or different materials.

If the first part 11a and the second part 11b are formed of different materials, it is preferable that the magnetic permeability or saturation flux density of part of the first and second parts 11a and 11b, which is located downstream with respect to the flow of the magnetic lines of force, be higher than the magnetic permeability or saturation flux density of part of the first and second parts 11a and 11b, which is located upstream with respect to the flow of the magnetic lines of force.

For example, in the example shown in FIG. 12, since the first part 11a is located on the downstream side with respect to the flow of the magnetic lines of force, it is preferable that the magnetic permeability or the saturation flux density of the first part 11a be higher than the magnetic permeability or the saturation flux density of the second part 11b.

In this case, since the second part 11b is located on the upstream side, it catches a large number of magnetic lines of force, and guides the magnetic lines of force to the first part 11a on the downstream side. The first part 11a on the downstream side has a higher magnetic permeability or a higher saturation flux density than that of the second part 11b on the upstream side, and can thus receive all the magnetic lines of force caught by the second part 11b on the upstream side.

It should be noted that it suffices that if the part on the downstream side is formed of a permalloy, the part on the upstream side is formed of a 42 alloy, which is a lower magnetic permeability or saturation flux density than that of the permalloy.

It the above relationship is reversed, not all the magnetic lines of force can be received by the part on the downstream side, and the magnetic lines of force not received become a leakage field, and adversely affect the magnetoresistive elements. It is therefore undesirable.

Furthermore, the first part 11a and the second part 11b may be formed to have the same thickness or different thicknesses.

If the first part 11a and the second part 11b have different thicknesses, it is preferable that the thickness of part of the first part 11a and the second part 11b which is located on the downstream side with respect to the magnetic lines of force be greater than that of part of the first part 11a and the second part 11b which is located on the upstream side with respect to the magnetic lines of force, for the same reason as described above.

Also, it is preferable that the permanent magnet 14 be formed of material having a high magnetic anisotropy and a strong magnetic force. For example, preferably, the permanent magnet 14 should contain a Co—Cr alloy, a Sm—Co alloy, a Co—Pt alloy, a Fe—Pt alloy, a Nd—Fe alloy, an Mn—Al alloy, an Al—Ni—Co alloy or the like. To the permanent magnet 14, ferrite, alnico, samarium-cobalt, neodymium or the like can be applied.

It should be noted that interface areas between the magnetic memory chip 10, the magnetic layer 11, the circuit board 12, the permanent magnet 14 and spacer 15 may each contain an adhesive sheet.

Figure 4:
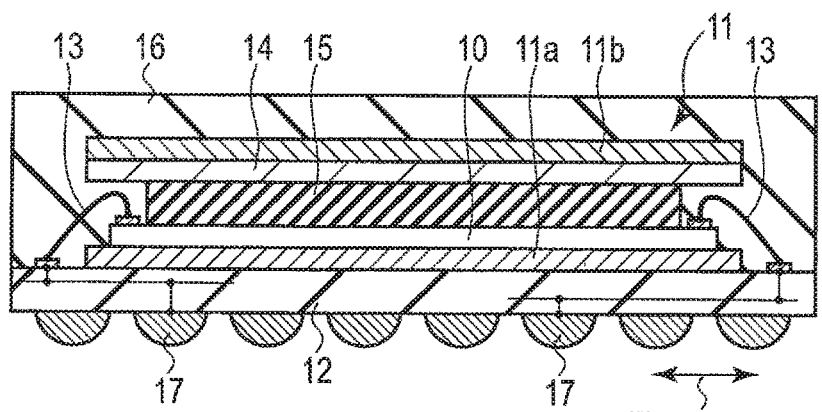
FIGS. 4 and 5 are cross-sectional views showing a first modification.
Figure 5:
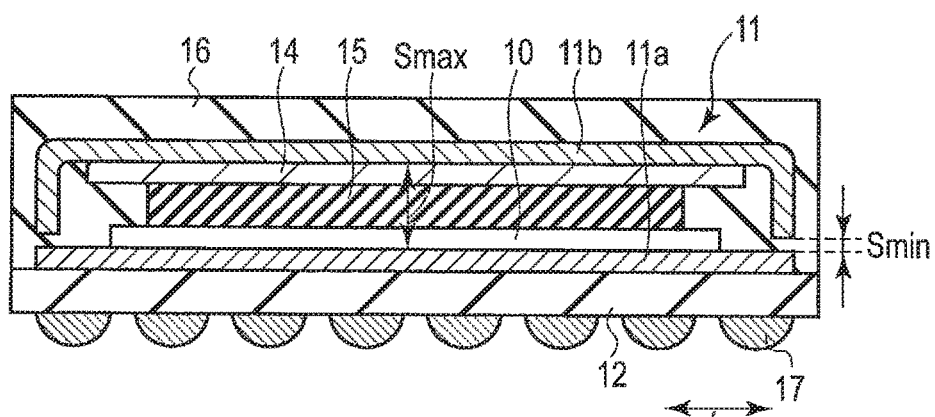

FIGS. 4 and 5 show a first modification of the magnetic memory device. FIG. 4 is a cross-sectional view taken along line II-II in FIG. 1, and FIG. 5 is a cross-sectional view taken along line III-III in FIG. 1.

In the first modification, the magnetic memory chip 10, the permanent magnet 14 and the spacer 15 are stacked in an order different from that of the example shown in FIGS. 2 and 3.

The magnetic memory chip 10 is provided on the first part 11a. The spacer 15 is provided on the magnetic memory chip 10. The permanent magnet 14 is provided between the spacer 15 and the second part 11b. That is, the permanent magnet 14 is provided adjacent to the upper surface of the magnetic memory chip 10.

The other points are the same as those in the example of FIGS. 2 and 3. Therefore, elements identical to those in the example of FIGS. 2 and 3 will be denoted by the same reference numerals as therein, and their detailed explanations will be omitted.

Figure 6:
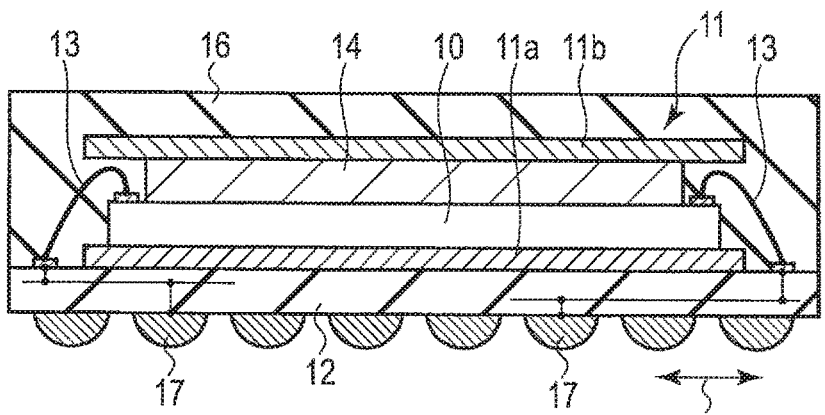
FIGS. 6 and 7 are cross-sectional views showing a second modification.
Figure 7:
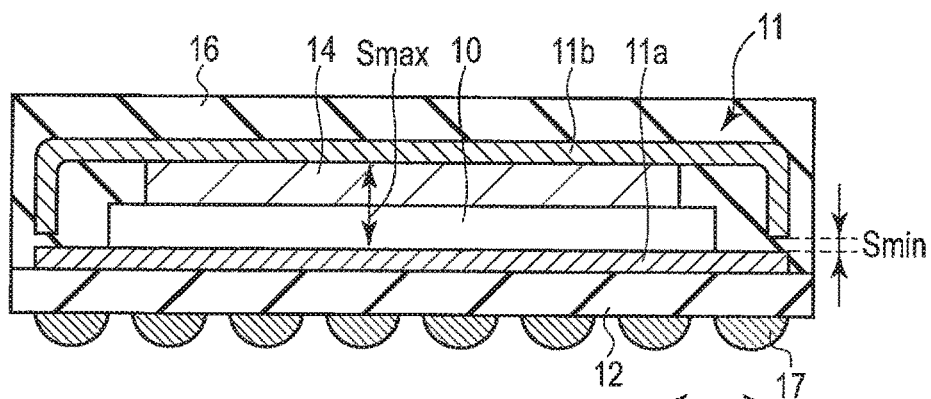

FIGS. 6 and 7 show a second modification of the magnetic memory device. FIG. 6 is a cross-sectional view taken along line II-II in FIG. 1, and FIG. 7 is a cross-sectional view taken along line III-III in FIG. 1.

In the second modification, no spacer is provided on the magnetic memory chip 10. In this regard, it is different from the example shown in FIGS. 2 and 3. Thus, the permanent magnet 14 is provided on the magnetic memory chip 10, and doubles as a spacer.

The other points are the same as those in the example of FIGS. 2 and 3. Therefore, elements identical to those in the example of FIGS. 2 and 3 will be denoted by the same reference numerals as therein, and their detailed explanations will be omitted.

Figure 8:
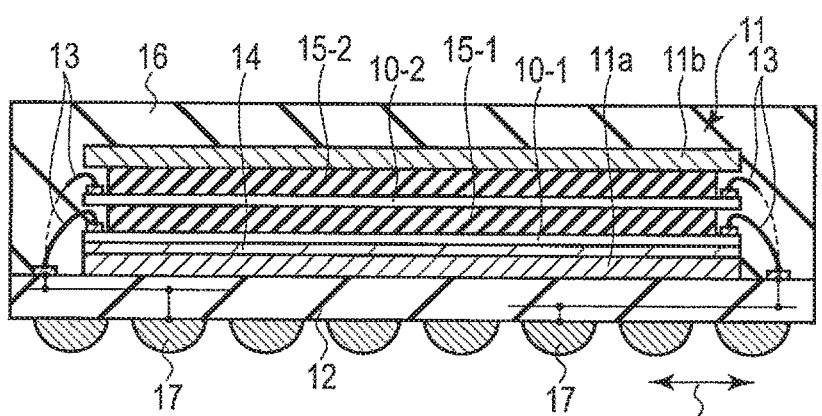
FIGS. 8 and 9 are cross-sectional views showing a third modification.
Figure 9:
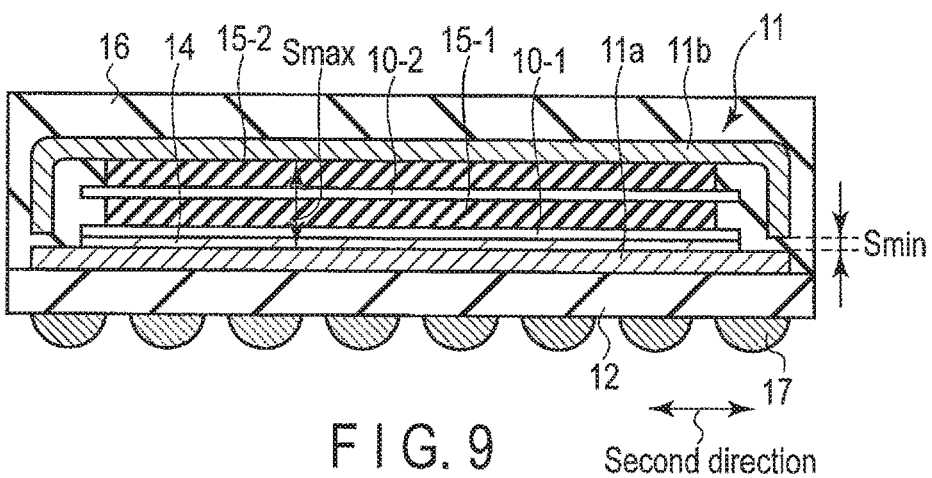

FIGS. 8 and 9 show a third modification of the magnetic memory device. FIG. 8 is a cross-sectional view taken along line II-II in FIG. 1, and FIG. 9 is a cross-sectional view taken along line III-III in FIG. 1.

In the third modification, a plurality magnetic memory chips 10-1 and 10-2 are stacked together. In this regard, it is different from the example shown in FIGS. 2 and 3.

The permanent magnet 14 is provided on the first part 11a. The magnetic memory chip 10-1 is provided on the permanent magnet 14. A spacer 15-1 is provided on the magnetic memory chip 10-1. The magnetic memory chip 10-2 is provided on the spacer 15-1. A spacer 15-2 is provided on the magnetic memory chip 10-2.

In the third modification, the magnetic memory chips 10-1 and 10-2 are provided, and the number of magnetic memory chips is two; however, three or more magnetic memory chips may be provided. In this case, it suffices that a single magnetic memory chip and a single spacer are handled as a single set, and a plurality of sets of magnetic memory chips and spacers are stacked together.

The other points are the same as those in the example of FIGS. 2 and 3. Therefore, elements identical to those in the example of FIGS. 2 and 3 will be denoted by the same reference numerals as therein, and their detailed explanations will be omitted.

Figure 10:
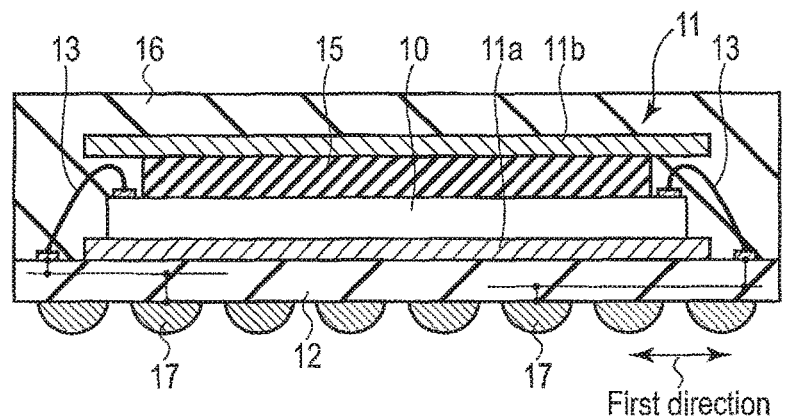
FIGS. 10 and 11 are cross-sectional views showing a fourth modification.
Figure 11:
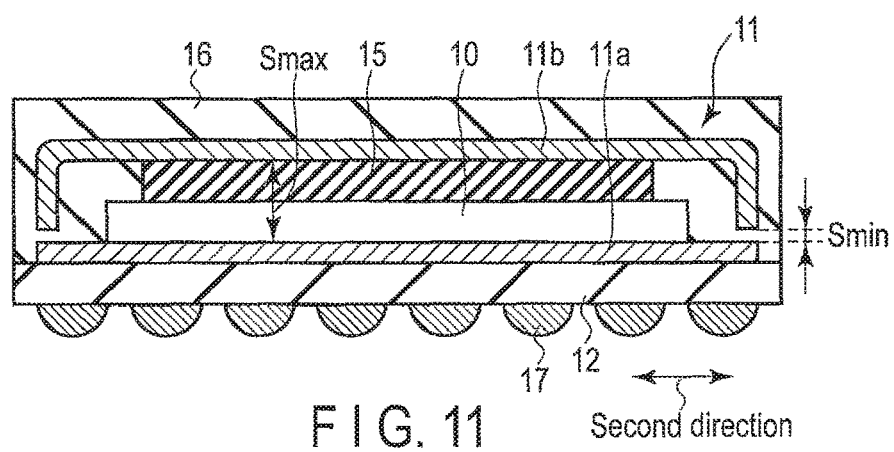

FIGS. 10 and 11 show a fourth modification of the magnetic memory device. FIG. 10 is a cross-sectional view taken along line II-II in FIG. 1, and FIG. 11 is a cross-sectional view taken along line III-III in FIG. 1.

In the fourth modification, no permanent magnet is provided between the first part 11a and the second part 11b. In this regard, it is different from the example of FIGS. 2 and 3. That is, in the fourth modification, the shift of the magnetization reversal characteristics of the magnetoresistive elements is not adjusted by an external permanent magnet for the magnetic memory chip 10.

However, in the fourth modification, a magnetic layer (including a shift cancel layer stacked on the magnetoresistive elements) which has the same function as a permanent magnet may be provided in the magnetic memory chip 10.

The magnetic memory chip 10 is provided on the first part 11a. The spacer 15 is provided on the magnetic memory chip 10.

The other points are the same as those of the example of FIGS. 2 and 3. Therefore, elements identical to those in the example of FIGS. 2 and 3 will be denoted by the same reference numerals as therein, and their detailed explanations will be omitted.

FIG. 12 shows the magnetic lines of force in the first embodiment.

To be more specific, magnetic lines MF of force from the permanent magnet 14 pass through the first part 11a and the second part 11b, and then return to the permanent magnet 14. That is, the magnetic lines MF of force from the permanent magnet 14 travel along a closed magnetic path. Furthermore, the magnetic lines MF of force are partially emitted as magnetic lines P of force from space between the first part 11a and the second part 11b to the outside. That is, it is possible to control the intensity of a magnetic field applied to magnetoresistive elements MTJ by controlling the width S of the space.

It should be noted that in the FIG., 10 denotes a magnetic memory chip, 21 denotes a semiconductor substrate, 22 denotes an interlayer insulating layer, 23 denotes a storage layer, 24 denotes a nonmagnetic insulating layer (tunnel barrier layer), 25 denotes a reference layer, and MA denotes a memory array.

FIGS. 13A, 13B and 13C show a method for manufacturing the magnetic memory device. Those figures correspond to the cross-sectional view of FIG. 2.

The following description is intended to explain the manufacturing method of the magnetic memory. Thus, a figure corresponding to the cross-sectional view of FIG. 3 is omitted.

First, as shown in FIG. 13A, a first part 11a is formed on a circuit board 12. Subsequently, a permanent magnet 14 is formed on the first part 11a, and a magnetic memory chip 10 is formed on the permanent magnet 14. Then, in a wire bonding step, the magnetic memory chip 10 and the circuit board 12 are connected to each other by bonding wires 13.

Next, as shown in FIG. 13B, a spacer 15 is formed on the magnetic memory chip 10. Furthermore, a second part 11b is formed on the spacer 15.

It should be noted that preferably adhesive sheets or the like should be interposed between the circuit board 12, the first, part 11a, the permanent magnet 14, the magnetic memory chip 10, the spacer 15 and the second part 11b in order to prevent those elements from being displaced from each other.

Thereafter, in a mold step, resin 16 is formed on the circuit board 12. The resin 16 covers and protects the first part 11a, the permanent magnet 14, the magnetic memory chip 10, the spacer 15 and the second part 11b.

Finally, as shown in FIG. 13C, a plurality of external terminals (for example, solder bolls) serving as a BGA are formed on the circuit board 12.

As a result, the magnetic memory device according to the first embodiment has been formed.

In such a manner, according to the first embodiment, it is possible to control the shift of the magnetization reversal characteristics of the magnetoresistive elements and improve the function of the magnetic memory device, without changing the kind or size of the magnet provided in the magnetic layer.

Second Embodiment

Figure 14:
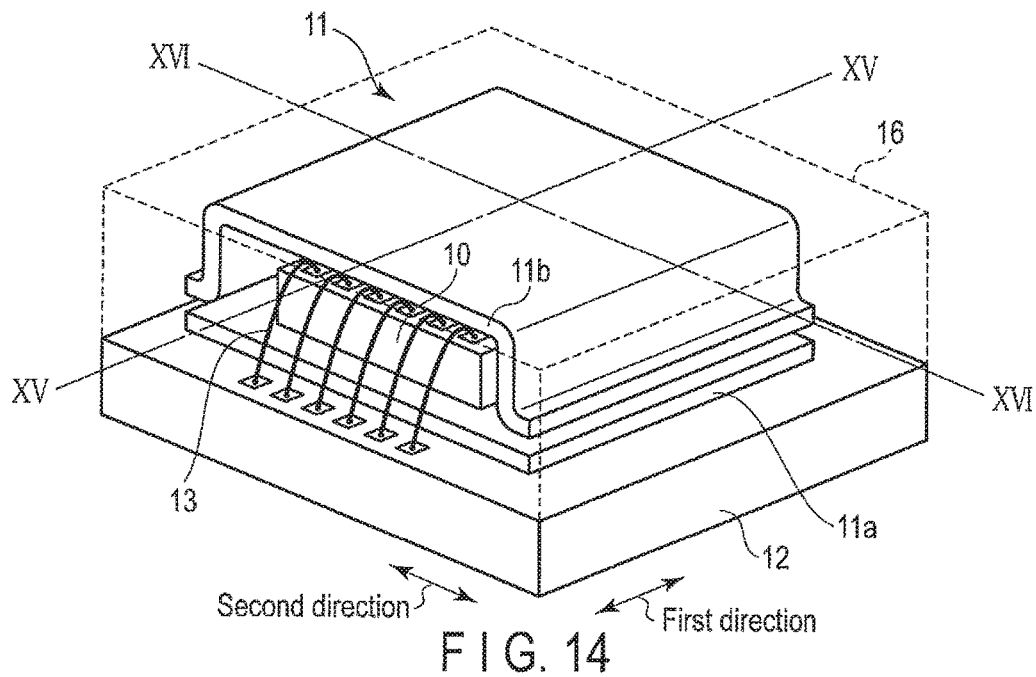
FIG. 14 is a perspective view showing a second embodiment of the magnetic memory device.
Figure 15:
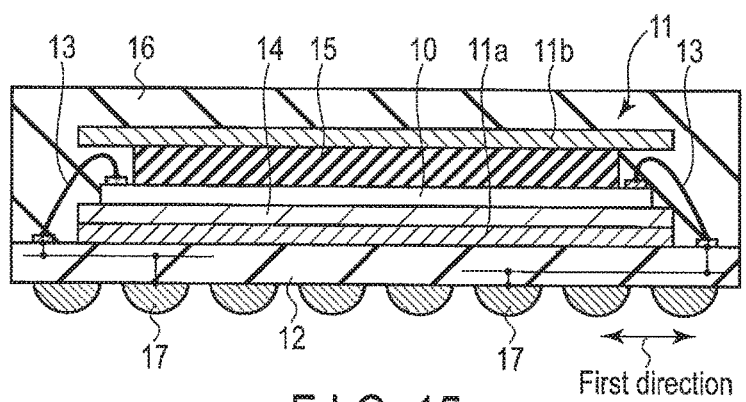
FIG. 15 is a cross-sectional view taken along line XV-XV in FIG. 14.
Figure 16:
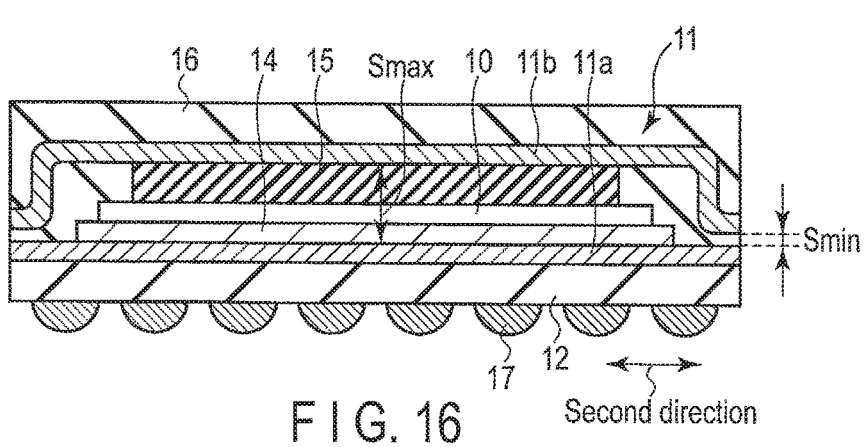
FIG. 16 is a cross-sectional view taken along line XVI-XVI in FIG. 14.

FIGS. 14-16 show a second embodiment of the magnetic memory device. FIG. 14 is a perspective view of the magnetic memory device, FIG. 15 is a cross-sectional view taken along line XV-XV in FIG. 14, and FIG. 16 is a cross-sectional view taken along line XVI-XVI in FIG. 14.

In the second embodiment, in the second direction, the ends of the first part 11a and, the second part 11b are different in structure from those in the first embodiment.

To be more specific, in the second embodiment, an area including parts of the first part 11a and the second part 11b, which are located opposite to each other, with space having the with Smin interposed between them is wider than that, of the first embodiment. In this structure, it is possible to exercise a control of magnetic lines of force to be emitted to the outside with a higher accuracy than in the first embodiment. However, since widening of the above area means increasing of the size of the magnetic memory device, the size of the area is determined in consideration of the control of the magnetic lines of force and the size of the magnetic memory device.

The other points are the same as in the first embodiment (FIGS. 1-3).

Therefore, elements identical to those explained with respect to the first embodiment will be denoted by the same reference numerals as therein, and their detailed explanations will be omitted.

Furthermore, with respect to the second embodiment also, the first to fourth modifications (FIGS. 4 to 11) of the first embodiment can be applied. Also, in the second embodiment, the same advantage can be obtained as in the first embodiment.

Third Embodiment

FIGS. 17-19 show a third embodiment of the magnetic memory device. FIG. 17 is a perspective view of the magnetic memory device, FIG. 18 is a cross-sectional view taken along line XVIII-XVIII in FIG. 17, and FIG. 19 is a cross-sectional view taken along line XIX-XIX in FIG. 17.

In the third embodiment, in the second direction, the ends of the first part 11a and the second part 11b are different in structure from those in the first embodiment.

To be more specific, in the third embodiment, the first part 11a is larger in size than the second part 11b, and the second part 11b is partially covered by the first part 11a. In this structure, it is possible to exercise a control of magnetic lines of force to be emitted to the outside with a higher accuracy than in the first embodiment.

The other points are the same as in the first embodiment (FIGS. 1-3).

Therefore, elements identical to those explained with respect to the first embodiment, will be denoted by the same reference numerals as therein, and their detailed explanations will be omitted. Furthermore, with respect to the third, embodiment also, the first to fourth modifications (FIGS. 4 to 11) of the first, embodiment can be applied.

Also, in the third embodiment, the same advantage can be obtained as in the first embodiment.

Fourth Embodiment

Figure 20:
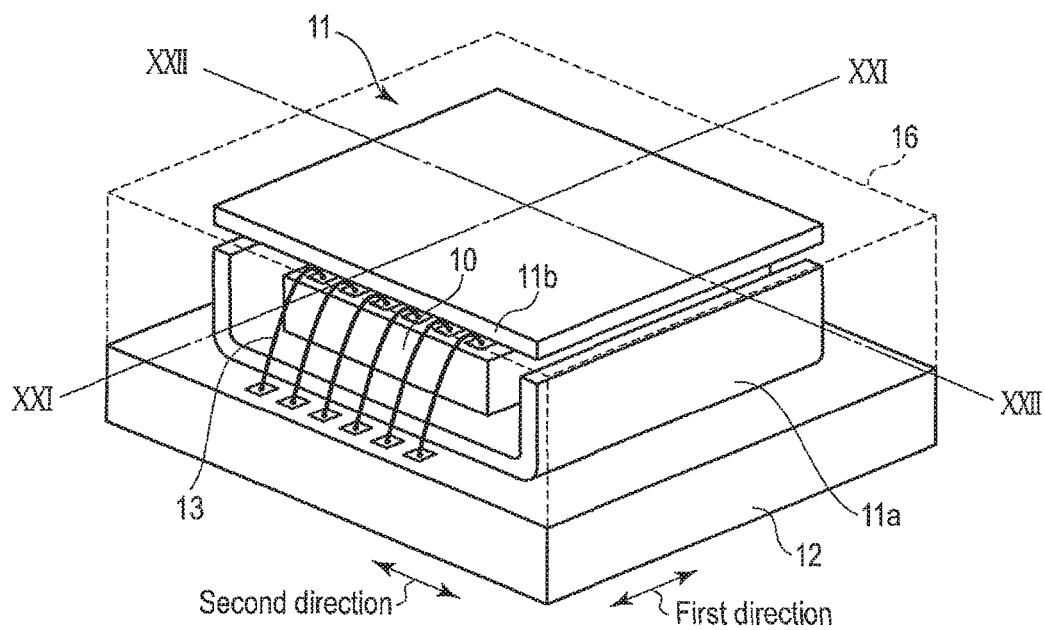
FIG. 20 is a perspective view showing a fourth embodiment of the magnetic memory device.
Figure 21:
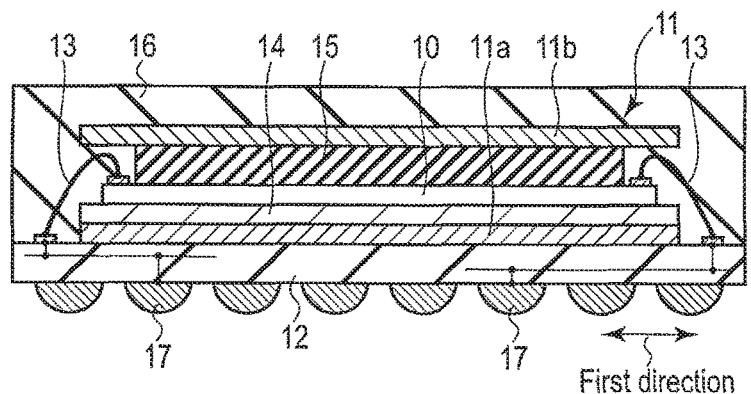
FIG. 21 is a cross-sectional view taken along line XXI-XXI in FIG. 20.
Figure 22:
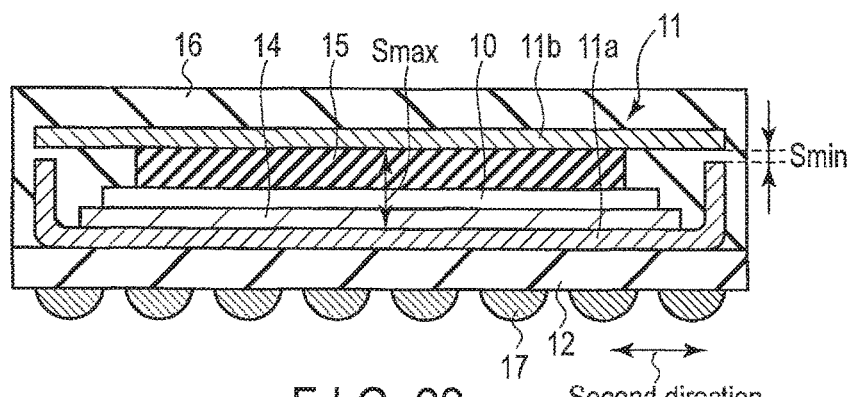
FIG. 22 is a cross-sectional view taken along line XXII-XXII in FIG. 20.

FIGS. 20-22 show a fourth embodiment of the magnetic memory device. FIG. 20 is a perspective view of the magnetic memory device, FIG. 21 is a cross-sectional view taken along line XXI-XXI in FIG. 20, and FIG. 22 is a, cross-sectional view taken along line XXII-XXII in FIG. 20.

In the fourth embodiment, in the second direction, the first part 11a covers two side surfaces of the magnetic memory chip 10. In this regard, it is different from the first embodiment.

To be more specific, in the fourth embodiment, the first part 11a, which is located below the magnetic memory chip 10, is U-shaped, and the second part 11b, which is located above the magnetic memory chip 10, is shaped in the form of a plate.

Furthermore, in the second direction, the first part 11a and the second part 11b include first ends and second ends, respectively, and with respect to the space between the first and second parts, the space between the first ends and the second ends are the narrowest. The narrowest space is Smin.

The other points are the same as in the first embodiment (FIGS. 1-3).

Therefore, elements identical to those explained with respect to the first embodiment will be denoted by the same reference numerals as therein, and their detailed explanations will be omitted. Furthermore, with respect to the second embodiment also, the first to fourth modifications (FIGS. 4 to 11) of the first embodiment can be applied.

Also, in the fourth embodiment, the same advantage can be obtained as in the first embodiment.

Fifth Embodiment

Figure 23:
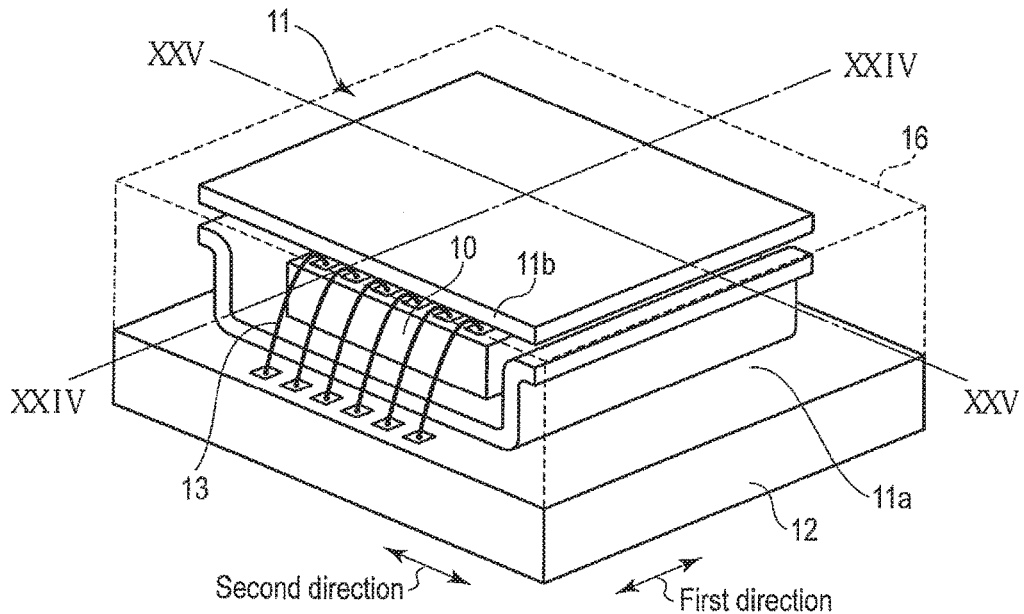
FIG. 23 is a perspective view showing a fifth embodiment of the magnetic memory device.
Figure 24:
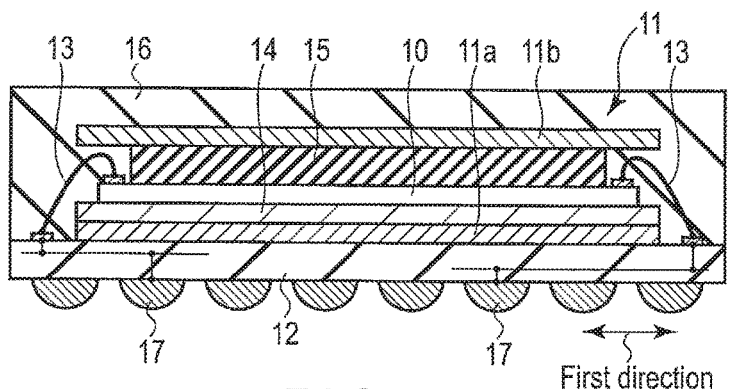
FIG. 24 is a cross-sectional view taken along line XXIV-XXIV in FIG. 23.
Figure 25:
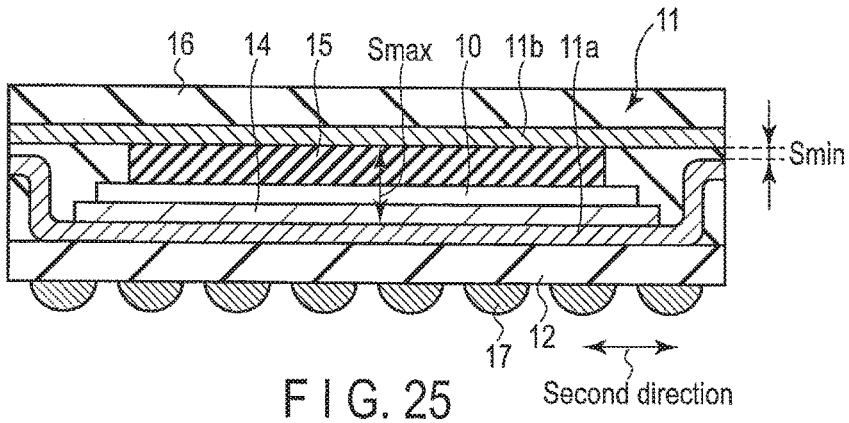
FIG. 25 is a cross-sectional view taken along line XXV-XXV in FIG. 23.

FIGS. 23-25 show a fifth embodiment of the magnetic memory device. FIG. 23 is a perspective view of the magnetic memory device, FIG. 24 is a cross-sectional view taken along line XXIV-XXIV in FIG. 23, and FIG. 25 is a cross-sectional view taken along line XXV-XXV in FIG. 23.

In the fifth embodiment, in the second direction, the ends of the first part 11a and the second part 11b are different in structure from those in the fourth embodiment.

To be more specific, in the fifth embodiment, an area including parts of the first part 11a and the second part 11b, which are located opposite to each other, with space having the with Smin interposed between them is wider than that of the fourth embodiment. In this structure, it is possible to exercise a control of magnetic lines of force to be emitted to the outside with a higher accuracy than in the fourth embodiment. However, since widening of the above area means increasing of the size of the magnetic memory device, the size of the area is determined in consideration of the control of the magnetic lines of force and the size of the magnetic memory device.

The other points are the same as in the the fourth embodiment.

Therefore, elements identical to those in the fourth embodiment will be denoted by the same reference numerals as therein, and their detailed explanations will be omitted.

Furthermore, with respect to the fifth embodiment also, the first to fourth modifications (FIGS. 4 to 11) of the first embodiment can be applied.

Also, in the fifth embodiment, the same advantage can be obtained as in the fourth embodiment.

Sixth Embodiment

Figure 26:
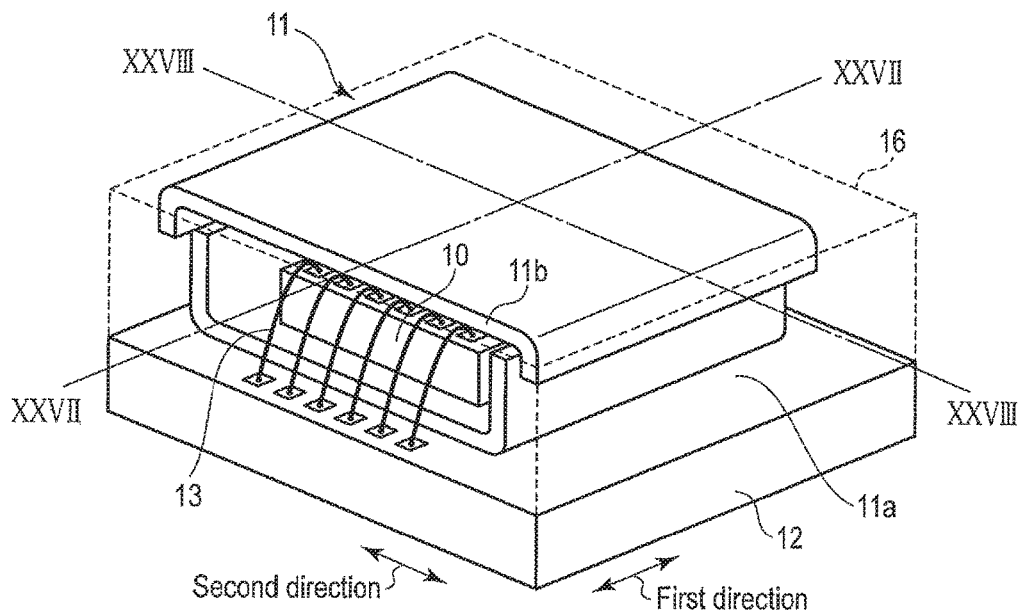
FIG. 26 is a perspective view showing a sixth embodiment of the magnetic memory device.
Figure 27:
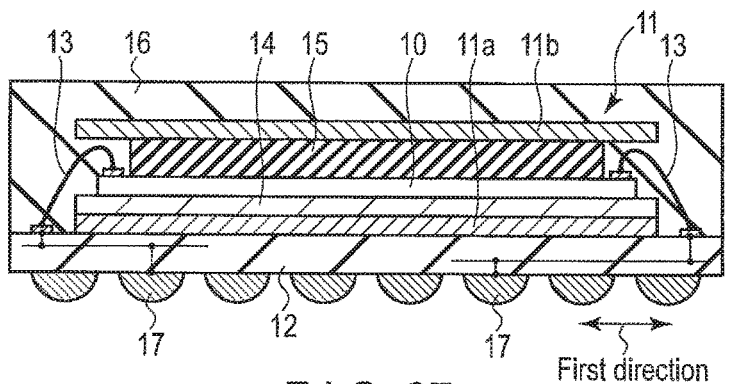
FIG. 27 is a cross-sectional view taken along line XXVII-XXVII in FIG. 26.
Figure 28:
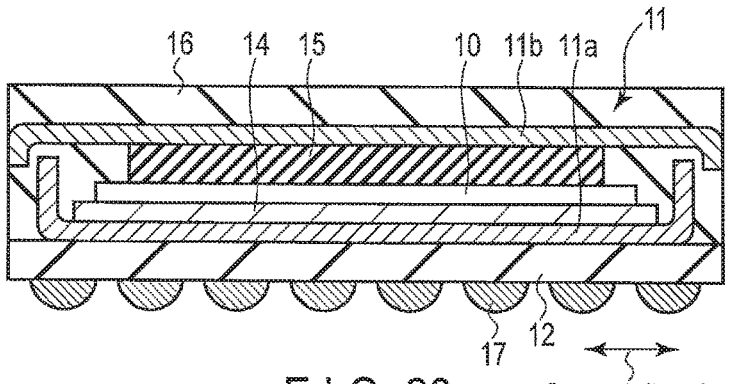
FIG. 28 is a cross-sectional view taken along line XXVIII-XXVIII in FIG. 26.

FIGS. 26-28 snow a sixth embodiment, of the magnetic memory device. FIG. 26 is a perspective view of the magnetic memory device, FIG. 27 is a cross-sectional view taken along line XXVII-XXVII in FIG. 26, and FIG. 28 is a cross-sectional view taken along line XXVIII-XXVIII in FIG. 26.

In the sixth embodiment, in the second direction, the ends of the first part 11a and the second part 11b are different in structure from those in the fourth embodiment.

To be more specific, in the sixth embodiment, the second part 11b is larger in size than the first part 11a, and the first part 11a is partially covered by the second part 11b. In this structure, it is possible to exercise a control of magnetic lines of force to be emitted to the outside with a higher accuracy than in the fourth embodiment.

The other points are the same as in the the fourth embodiment.

Therefore, elements identical to those in the fourth embodiment will be denoted by the same reference numerals as therein, and their detailed explanations will be omitted. Furthermore, with respect to the fourth embodiment also, the first to fourth modifications (FIGS. 4 to 11) of the first embodiment can be applied.

Also, in the sixth embodiment, the same advantage can be obtained as in the fourth embodiment.

Seventh Embodiment

FIGS. 29-31 snow a seventh embodiment of the magnetic memory device. FIG. 29 is a perspective view of the magnetic memory device, FIG. 30 is a cross-sectional view taken along line XXX-XXX in FIG. 29, and FIG. 31 is a cross-sectional view taken along line XXXI-XXXI in FIG. 29.

In the seventh embodiment, the first part 11a and the second part 11b are provided as parallel plates. In this relationship, it is different from the first embodiment.

To be more specific, in the seventh embodiment, the width of the space between the first part 11a and the second part 11b is substantially fixed (Smax).

The first part 11a is provided on the circuit board 12, the permanent magnet 14 is provided on the first part 11a, the magnetic memory chip 10 is provided on the permanent magnet 14, and the spacer 15 is provided between the magnetic memory chip 10 and the second part 11b.

In this structure, the permanent magnet 14 is provided adjacent to the magnetic memory chip 10, and in the first and second directions, each of the first part 11a and the second part 11b is larger in size than the magnetic memory chip 10.

Therefore, in the seventh embodiment, it is possible to control the shift of the magnetization reversal characteristics of the magnetoresistive elements in the magnetic memory chip 10 and improve the function of the magnetic memory device.

The other points are the same as in the first embodiment (FIGS. 1-3).

Therefore, elements identical to those explained with respect to the first embodiment will be denoted by the same reference numerals as therein, and their detailed explanations will be omitted. Furthermore, with respect to the seventh embodiment also, the first to fourth modifications (FIGS. 4 to 11) of the first embodiment can be applied.

Eighth Embodiment

FIGS. 32-34 show an eighth embodiment of the magnetic memory device. FIG. 32 is a perspective view of the magnetic memory device, FIG. 33 is a cross-sectional view taken along line XXXIII-XXXIII in FIG. 32, and FIG. 34 is a cross-sectional view taken along line XXXIV-XXXIV in FIG. 33.

The eighth embodiment is featured in that in the first embodiment, the first ends of the first part 11a are connected to the second ends of the second part 11b.

In order to effectively shield the magnetic memory chip 10 from an external magnetic field, and efficiently apply a magnetic field from the permanent magnet 14 to the magnetic memory chip 10, it is preferable that the magnetic layer 11 (the first part 11a and the second part 11b) have a closed loop structure. In this case, the magnetic field from the permanent magnet 14 travels along a closed magnetic path.

The other points are the same as in the first embodiment.

Therefore, elements identical to those in the first embodiment will be denoted by the same reference numerals as therein, and their detailed explanations will be omitted. Furthermore, in the eighth embodiment also, the first to fourth modifications (FIGS. 4 to 11) of the first embodiment can be applied.

Ninth Embodiment

Figure 35:
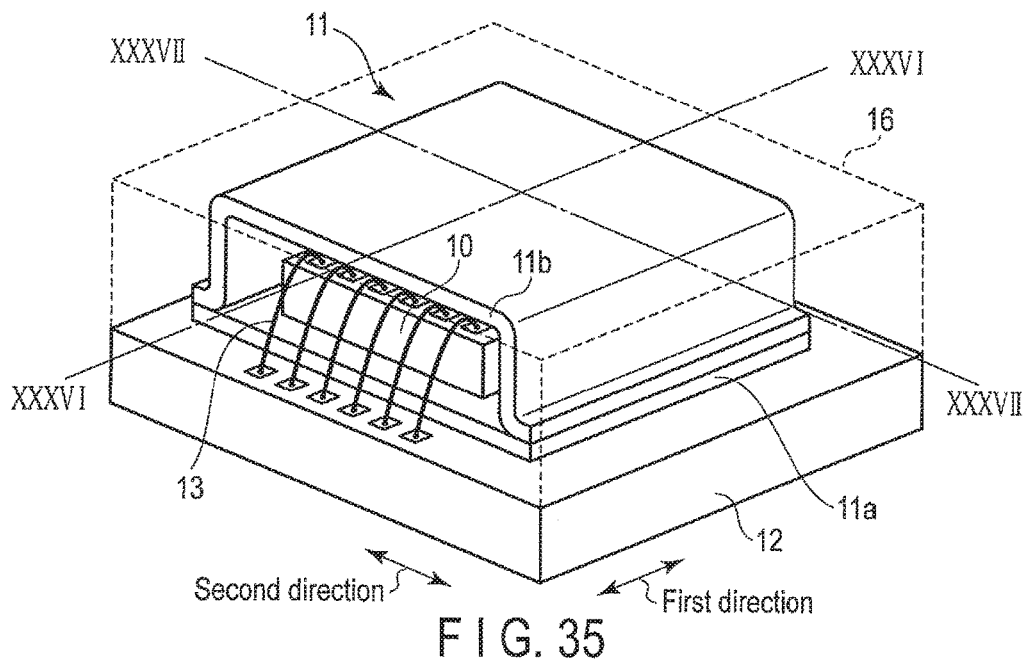
FIG. 35 is a perspective view showing a ninth embodiment of the magnetic memory device.
Figure 36:
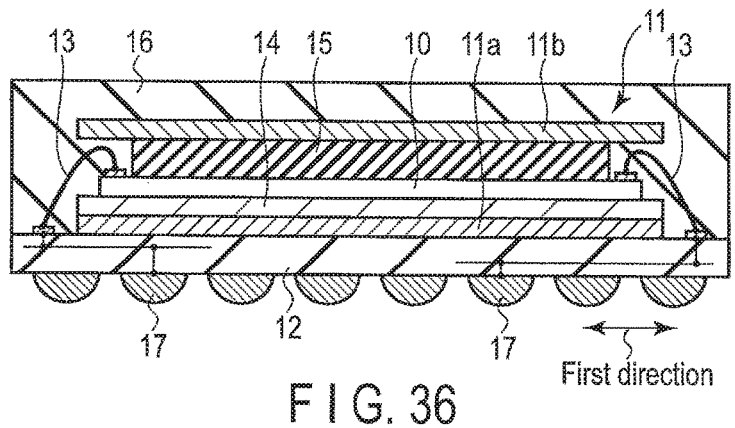
FIG. 36 is a cross-sectional view taken along line XXXVI-XXXVI in FIG. 35.
Figure 37:
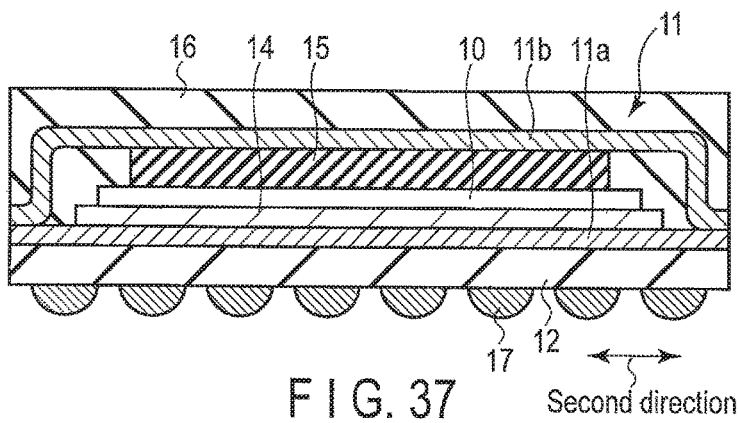
FIG. 37 is a cross-sectional view taken along line XXXVII-XXXVII in FIG. 35.

FIGS. 35-37 show a ninth embodiment of the magnetic memory device. FIG. 35 is a perspective view of the magnetic memory device, FIG. 36 is a cross-sectional view taken along line XXXVI-XXXVI in FIG. 35, and FIG. 37 is a cross-sectional view taken along line XXXVII-XXXVII in FIG. 35.

The ninth embodiment is featured in that in the second embodiment, the first ends of the first part 11a are connected to the second ends of the second part 11b.

In this case, as in the eighth embodiment, it is possible to effectively shield the magnetic memory chip 10 from an external magnetic field, and efficiently apply a magnetic field from the permanent magnet 14 to the magnetic memory chip 10.

The other points are the same as in the second embodiment.

Therefore, elements identical to those in the second embodiment will be denoted by the same reference numerals as therein, and their detailed explanations will be omitted. Furthermore, with respect, to the ninth embodiment also, the first to fourth modifications (FIGS. 4 to 11) of the first embodiment can be applied.

Tenth Embodiment

Figure 38:
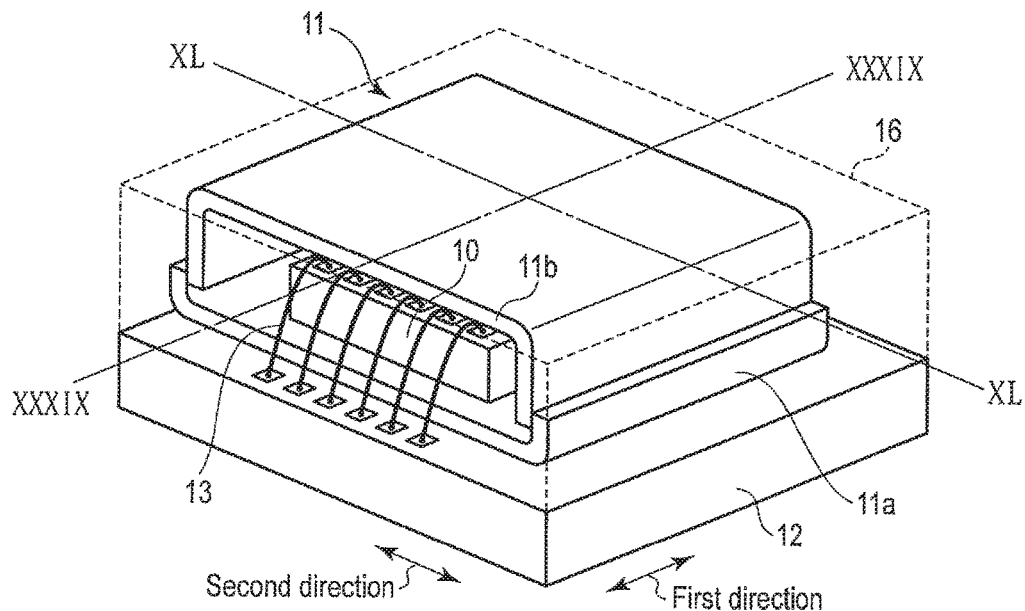
FIG. 38 is a perspective view showing a tenth embodiment of the magnetic memory device.
Figure 39:
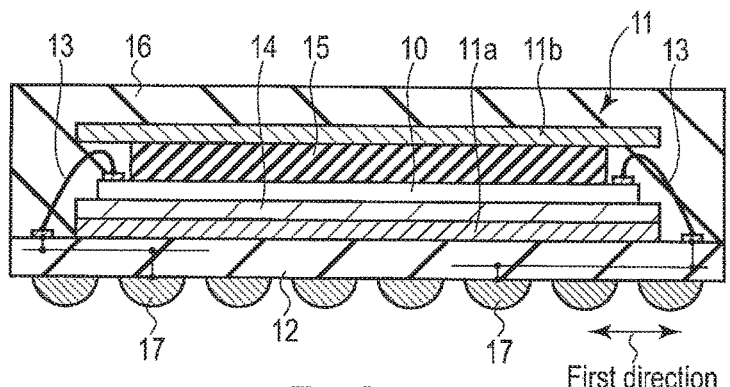
FIG. 39 is a cross-sectional view taken along line XXXIX-XXXIX in FIG. 38.
Figure 40:
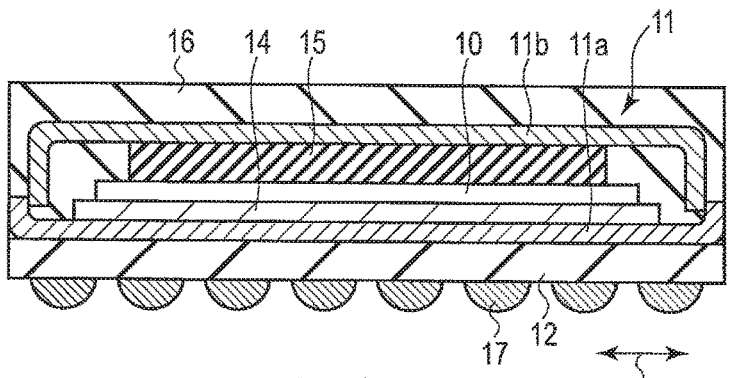
FIG. 40 is a cross-sectional view taken along line XL-XL in FIG. 38.

FIGS. 38-40 show a tenth embodiment of the magnetic memory device. FIG. 38 is a perspective view of the magnetic memory device, FIG. 39 is a cross-sectional view taken along line XXXIX-XXXIX in FIG. 38, and FIG. 40 is a cross-sectional view taken along line XL-XL in FIG. 38.

The tenth embodiment is featured in that in the third embodiment, the first ends of the first part 11a are connected to the second ends of the second part 11b are connected to each other.

In this case, as in the eighth embodiment, it is possible to effectively shield the magnetic memory chip 10 from an external magnetic field, and efficiently apply a magnetic field from the permanent magnet 14 to the magnetic memory chip 10.

The other points are the same as in the third embodiment.

Therefore, elements identical to those in the third embodiment will be denoted by the same reference numerals as therein, and their detailed explanations will be omitted.

Furthermore, with respect to the tenth embodiment also, the first to fourth modifications (FIGS. 4 to 11) of the first embodiment can be applied.

Eleventh Embodiment

FIGS. 41-43 show an eleventh embodiment of the magnetic memory device. FIG. 41 is a perspective view of the magnetic memory device, FIG. 42 is a cross-sectional view taken along line XLII-XLII in FIG. 41, and FIG. 43 is a cross-sectional view taken along line XLIII-XLIII in FIG. 41.

The eleventh embodiment is featured in that in the fourth embodiment, the first ends of the first part 11a are connected to the second ends of the second part 11b.

In this case, as in the eighth embodiment, it is possible to effectively shield the magnetic memory chip 10 from an external magnetic field, and efficiently apply a magnetic field from the permanent magnet 14 to the magnetic memory chip 10.

The other points are the same as in the fourth embodiment.

Therefore, elements identical to those in the fourth embodiment will be denoted by the same reference numerals as therein, and their detailed explanations will be omitted. Furthermore, in the eleventh embodiment also, the first to fourth modifications (FIGS. 4 to 11) of the first embodiment can be applied.

Twelfth Embodiment

Figure 44:
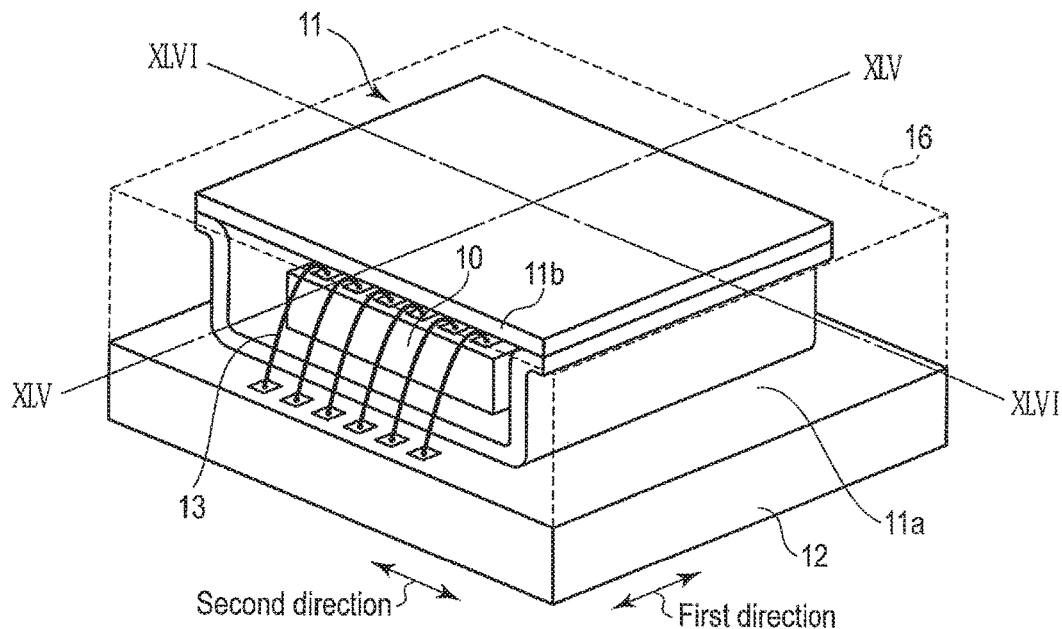
FIG. 44 is a perspective view showing a twelfth embodiment of the magnetic memory device.
Figure 45:
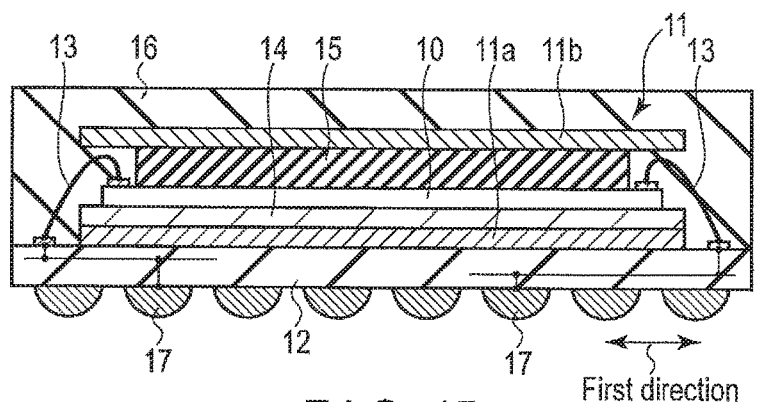
FIG. 45 is a cross-sectional view taken along line XLV-XLV in FIG. 44.
Figure 46:
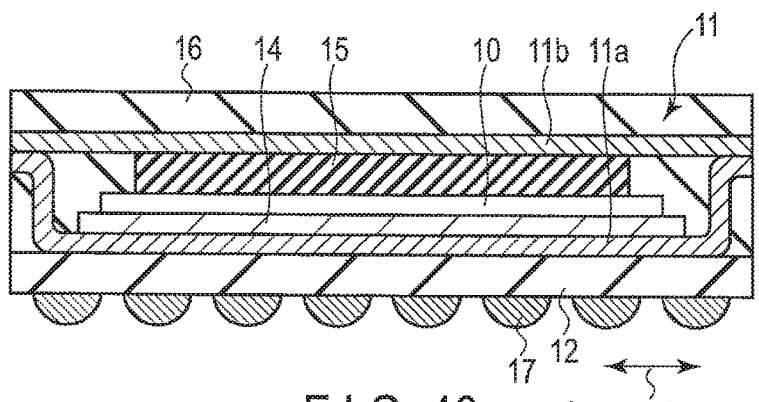
FIG. 46 is a cross-sectional view taken along line XLVI-XLVI in FIG. 44.

FIGS. 44-46 show a twelfth embodiment of the magnetic memory device. FIG. 44 is a perspective view of the magnetic memory device, FIG. 45 is a cross-sectional view taken along line XLV-XLV in FIG. 44, and FIG. 46 is a cross-sectional view taken along line XLVI-XLVI in FIG. 44.

The twelfth embodiment is featured in that in the fifth embodiment, the first ends of the first part 11a are connected to the second ends of the second part 11b.

In this case, as in the eighth embodiment, it is possible to effectively shield the magnetic memory chip 10 from an external magnetic field, and efficiently apply a magnetic field from the permanent magnet 14 to the magnetic memory chip 10.

The other points are the same as in the fifth embodiment.

Therefore, elements identical to those in the fifth embodiment will be denoted by the same reference numerals as therein, and their detailed explanations will be omitted. Furthermore, in the twelfth embodiment also, the first to fourth modifications (FIGS. 4 to 11) of the first embodiment can be applied.

Thirteenth Embodiment

FIGS. 47-49 show a thirteenth embodiment of the magnetic memory device. FIG. 47 is a perspective view of the magnetic memory device, FIG. 48 is a cross-sectional view taken along line XLVIII-XLVIII in FIG. 47, and FIG. 49 is a cross-sectional view taken along line XLIX-XLIX in FIG. 47.

The thirteenth embodiment is featured in that in the sixth embodiment, the first ends of the first part 11a are connected to the second ends of the second part 11b.

In this case, as in the eighth embodiment, it is possible to effectively shield the magnetic memory chip 10 from an external magnetic field, and efficiently apply a magnetic field from the permanent magnet 14 to the magnetic memory chip 10.

The other points are the same as in the sixth embodiment.

Therefore, elements identical to those in the sixth embodiment will be denoted by the same reference numerals as therein, and their detailed explanations will be omitted.

Furthermore, in the thirteenth embodiment also, the first to fourth modifications (FIGS. 4 to 11) of the first embodiment can be applied.

Fourteenth Embodiment

Figure 50:
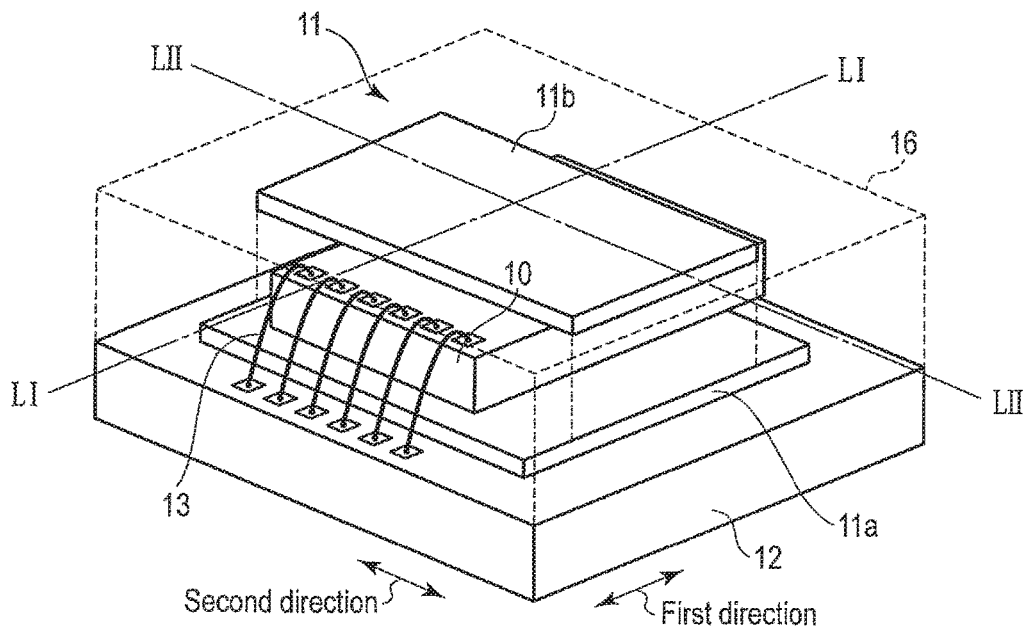
FIG. 50 is a perspective view showing a fourteenth embodiment of the magnetic memory device.
Figure 51:
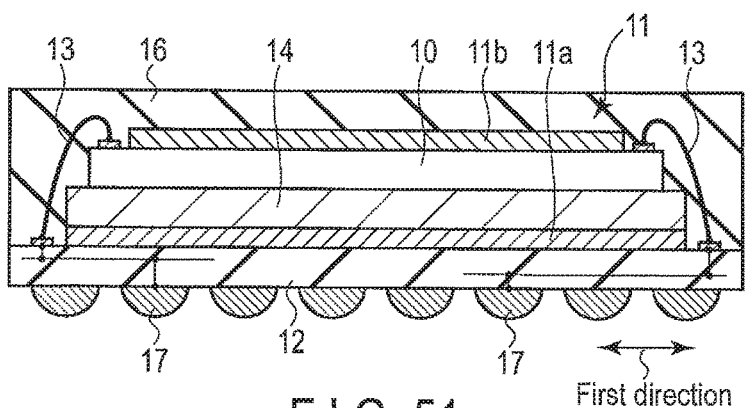
FIG. 51 is a cross-sectional view taken along line LI-LI in FIG. 50.
Figure 52:
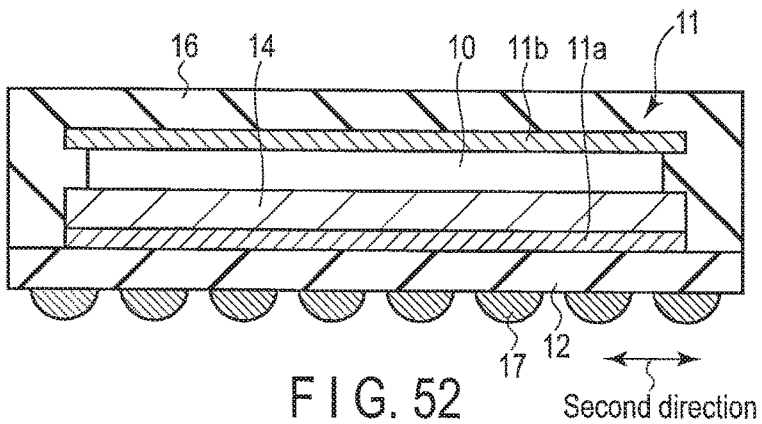
FIG. 52 is a cross-sectional view taken along line LII-LII in FIG. 50.

FIGS. 50-52 show a fourteenth embodiment of the magnetic memory device. FIG. 50 is a perspective view of the magnetic memory device, FIG. 51 is a cross-sectional view taken along line LI-LI in FIG. 50, and FIG. 52 is a cross-sectional view taken along line LII-LII in FIG. 50.

In the fourteenth embodiment, unlike the first to thirteenth embodiments, the spacer provided to ensure the area for connection of the bonding wires 13 is omitted. In this regard, the fourteenth embodiment is different from the first to thirteenth embodiments. In this case, in order to ensure the area for connection of the bonding wires 13, in the first direction, the second part 11b provided on the magnetic memory chip 10 is made smaller in size than the magnetic memory chip 10.

The first part 11a is provided on the circuit board 12, the permanent magnet 14 is provided on the first part 11a, the magnetic memory chip 10 is provided on the permanent magnet 14, and the second part 11b is provided on the magnetic memory chip 10.

In the first direction, the first part 11a is larger in size than the magnetic memory chip 10. On the other hand, in the first direction, the second part 11b is smaller in size than the magnetic memory chip 10.

In the fourteenth embodiment, the first part 11a and the second part 11b are provided as parallel plates (this relationship corresponds to that of the seventh embodiment). However, instead of such a structure, in the second direction, the first and second ends of the first part 11a and the second part 11b may have such a structure as explained with respect to the first to sixth embodiments and the eighth to thirteen embodiments.

The other points are the same as in the first to thirteen embodiments.

Therefore, elements identical to those in the first to thirteenth embodiments will be denoted by the same reference numerals as therein, and their detailed explanations will be omitted.

(Application Example)

An application example obtained in the case where in each of the above embodiments, the magnetic memory chip is a magnetic random access memory (MRAM) will be explained.

Figure 53:
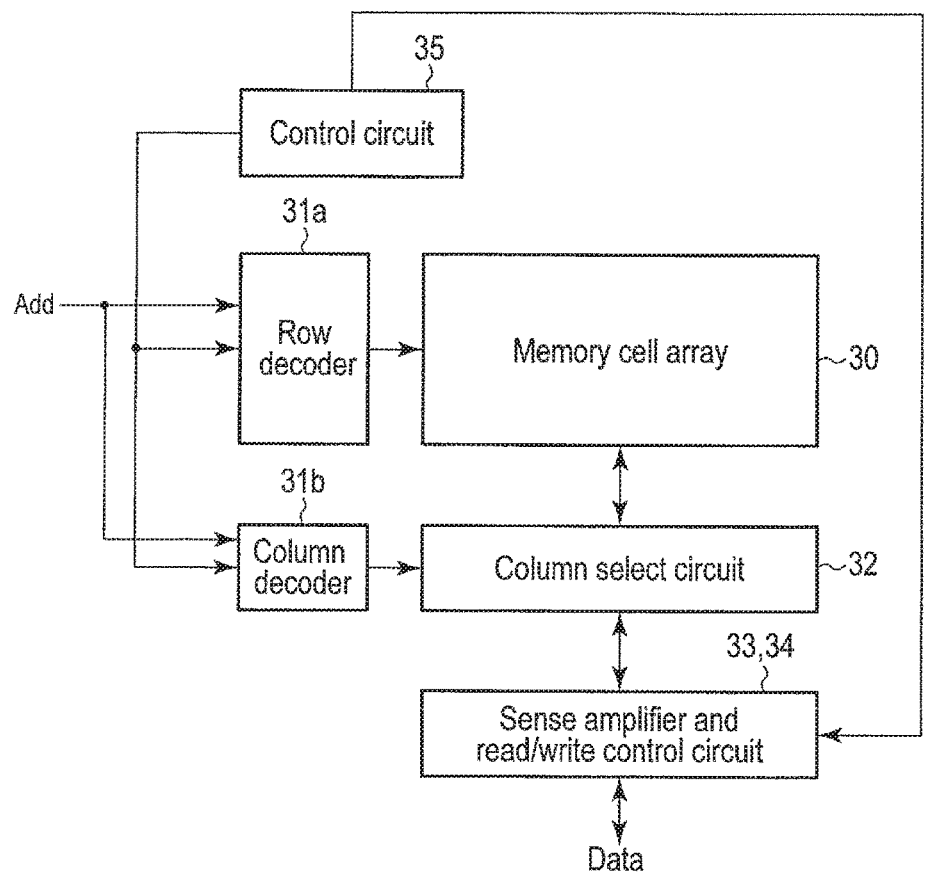
FIG. 53 is a view showing an application example of an MRAM.

FIG. 53 shows an MRAM.

A memory cell array 30 comprises a plurality of memory cells. A row decoder 31a and a column decoder 31b get random access to one of the memory cells in the memory cell array 30 based on an address signal Add.

A column selection circuit 32 functions to electrically connect the memory cell array 30 and a sense amplifier 33 to each other based on a signal from the column decoder 31b.

A read/write control circuit 34 supplies, at a read time, read current to a single memory cell selected from the memory cell array 30. The sense amplifier 33 detects the read current to check data stored in the selected memory cell.

Furthermore, the read/write control circuit 34 supplies, at a write time, to a single memory cell selected from the memory cell array 30, thereby writing data to the selected memory cell.

A control circuit 35 controls operations of the row decoder 31a, the column decoder 31b, the sense amplifier 33 and the read/write control circuit 34.

Figure 54:
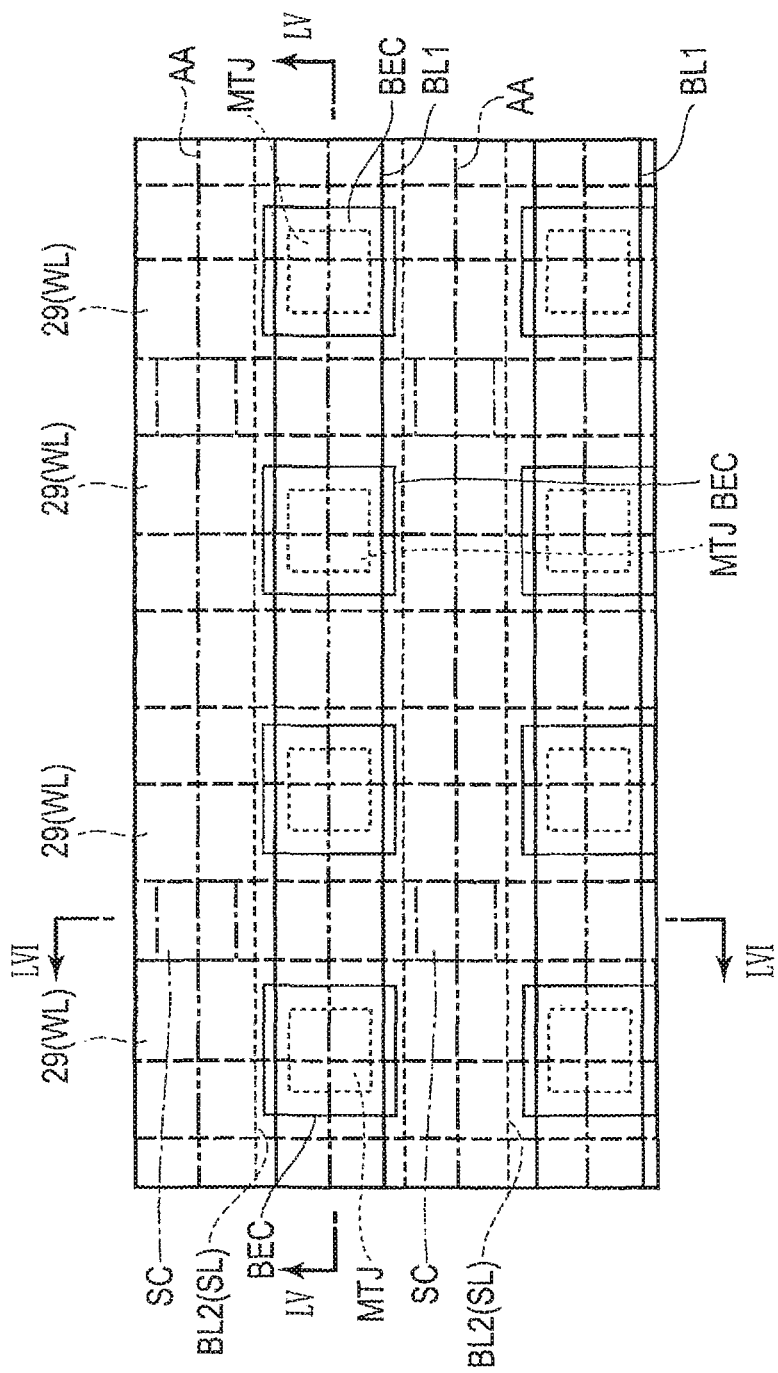
FIG. 54 is a view showing memory cells of the MRAM.

FIGS. 54 to 56 show memory cells in the MRAM. FIG. 54 is a plan view of the memory cells of the MRAM, FIG. 55 is a cross-sectional view taken along line LV-LV in FIG. 54, and FIG. 56 is a cross-sectional view taken along line LVI-LVI in FIG. 54.

In this application example, the memory cells of the MRAM comprise select transistors (e.g., FETs) ST and magnetoresistive elements MTJ.

The select transistors ST are provided in an active area AA in a semiconductor substrate 21. The active area AA is surrounded by an element isolation insulating layer 20 provided in the semiconductor substrate 21. In the application example, the element isolation insulating layer 20 has a shallow trench isolation (STI) structure.

The select transistors ST comprise source/drain diffusion layers 27a and 27b provided in the semiconductor substrate 21, gate electrodes (word lines) 29 and gate insulating layers 28 provided between the source/drain diffusion layers 27a and 27b in the semiconductor substrate 21. The select transistors ST of the application example have a so-called buried gate structure in which the gate electrodes 29 are buried in the semiconductor substrate 21.

An interlayer insulating layer (for example, an oxide silicon layer) 22a covers the select transistors ST. Contact plugs BEC and SC are provided in the interlayer insulating layer 22a. The contact plugs BEC are connected to the source/drain diffusion layers 27a, and the contact plugs SC are connected to the source/drain diffusion layers 27b. The contact plugs EEC and SC each include one of W, Ta, Ru and Ti.

The magnetoresistive elements MTJ are provided on the contact plugs BEC. The magnetoresistive elements MTJ comprise storage layers 23, nonmagnetic insulating layers 24, reference layers 25 and gap layers 26.

The resistance of each of the magnetoresistive elements MTJ varies depending on a relative magnetization direction of its storage layer 23 and reference layer 25 because of a magnetoresistive effect. For example, the resistance of each of the magnetoresistive elements MTJ is low when with respect to the magnetization direction, the storage layer 23 and the reference layer 25 are in a parallel state in which the magnetization directions of the storage layer 23 and the reference layer 25 are the same as each other, and the resistance of each magnetoresistive element MTJ is high when with respect to the magnetization direction, the storage layer 23 and the reference layer 25 are in an antiparallel state in which the magnetization directions of those layers are opposite to each other.

The storage layer 23 and the reference layer 25 are formed of, for example, CoFeB, MgFeO or the like.

If each magnetoresistive element MTJ has perpendicular magnetization, it is preferable that the storage layer 23 and the reference layer 25 have an artificial lattice in which Pt, Co and TbCoFe having perpendicular magnetic anisotropy are stacked together, and FePt having a $L_{1_o}$ crystal structure, and the like. In this case, between the storage layer 23 and the nonmagnetic insulating layer 24 or between the nonmagnetic insulating layer 24 and the reference layer 25, preferably, CoFeB should be provided as an interface layer.

The nonmagnetic insulating layer 24 is formed of, for example, MgO or AlO. Also, the nonmagnetic insulating layer 24 may be formed of an oxide such as Al, Si, Be, Mg, Ca, Sr, Ba, Sc, Y, La, Zr or Hf. If the nonmagnetic insulating layer 24 is formed of MgO, its thickness is set to approximately 1 nm because of a limited resistance.

Contact plugs TEC are provided on the magnetoresistive elements MTJ. An interlayer insulating layer (for example, an oxide silicon layer) 22b covers the magnetoresistive elements MTJ.

Bit lines BL1 are connected to the magnetoresistive elements MTJ, with the contact plugs TEC interposed between them. Bit lines BL2 are connected to source/drain diffusion layers 27b, with contact plugs SC interposed between them. The bit lines BL2 also function, for example, at the read time, as source lines SL to which a ground potential is applied.

Figure 57:
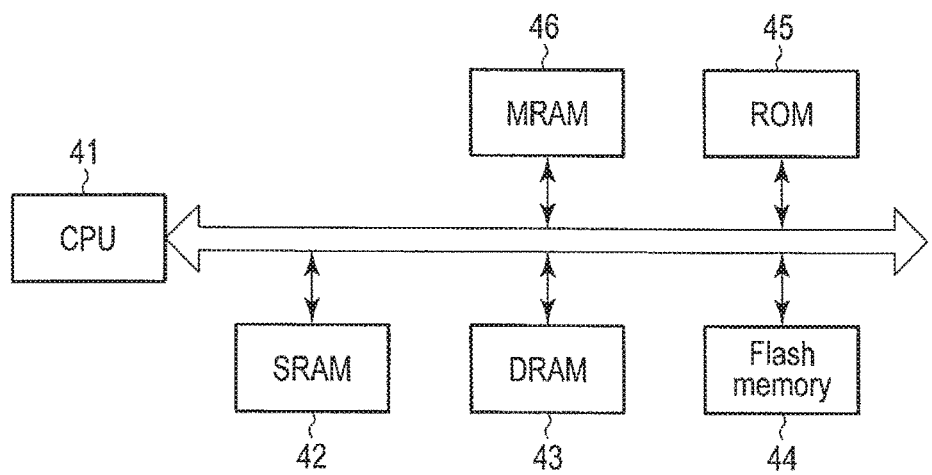
FIG. 57 is a view showing a nonvolatile cache system.

FIG. 57 shows an example of a nonvolatile cache system.

If an MRAM is used as a cache memory of a processor system, it can lower the power consumption of the processor system.

That is, the MRAM is featured in that for example, the number of rewrites is unlimited, read/write can be performed at a high speed, and it has a large capacity. Therefore, it is possible to achieve a processor system whose power consumption is low, by applying an MRAM which is a nonvolatile memory, instead of a volatile memory such as an SRAM or a DRAM which is generally used as a cache memory.

A CPU 41 controls an SRAM 42, a DRAM 43, a flash memory 44, a ROM 45 and an MRAM 46.

MRAMs 46 can be used in place of the SRAM 42, the DRAM 43, the flash memory 44 and the ROM 45. Thus, at least one of the SRAM 42, the DRAM 43, the flash memory 44 and the ROM 45 may be omitted.

The MRAM 46 can be used as a nonvolatile cache memory (for example, an L2 cache).

CONCLUSION

According to the above embodiments, the magnetic memory chip can be effectively shielded from the external magnetic field. Furthermore, it is possible to control the shift of the magnetization reversal characteristics of the magnetoresistive elements and improve the function of the magnetic memory device without changing, for example, the kind or size of the magnet in the magnetic layer serving as the magnetic shield layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. further A magnetic memory device comprising:
   a magnetic memory chip having a magnetoresistive element;
   a magnetic layer having first and second portions which are separated from each other so that there is a space between the first and second portions, the first portion covering a first main surface of the magnetic memory chip, and the second portion covering a second main surface of the magnetic memory chip opposite from the first main surface of the magnetic memory chip;
   a circuit board on which the magnetic layer is mounted;

a bonding wire connecting between the magnetic memory chip and the circuit board in a first direction parallel to the first and second main surfaces; and a permanent magnet that is adjacent to one of the first and second main surfaces of the magnetic memory chip;

wherein:

the first portion is nearer the circuit board than the second portion, each of the first and second portions has a size larger than a size of the magnetic memory chip in the first direction, the second portion covers side surfaces of the magnetic memory chip in a second direction parallel to the first and second main surfaces and orthogonal to the first direction, and the first portion has first and second ends in the second direction, the second portion has third and fourth ends in the second direction, the first end and the third end face each other in a third direction orthogonal to the first and second directions, and the second end and the fourth end face each other in the third direction.

2. The device of claim 1, further comprising:

a spacer between the magnetic memory chip and the second portion, wherein the permanent magnet is provided on the first portion, and the magnetic memory chip is provided on the permanent magnet.

3. The device of claim 1, further comprising:

a spacer between the magnetic memory chip and the second portion, wherein the magnetic memory chip is provided on the first portion, and the permanent magnet is provided between the spacer and the second portion.

4. The device of claim 1, wherein the magnetic memory chip is provided on the first portion, and the permanent magnet is provided between the magnetic memory chip and the second portion.

5. A further A magnetic memory device comprising:

a magnetic memory chip having a magnetoresistive element;

a magnetic layer having first and second portions which are separated from each other so that there is a space between the first and second portions, the first portion covering a first main surface of the magnetic memory chip, and the second portion covering a second main surface of the magnetic memory chip opposite from the first main surface of the magnetic memory chip;

a circuit board on which the magnetic layer is mounted;

a bonding wire connecting between the magnetic memory chip and the circuit board in a first direction parallel to the first and second main surfaces; and a permanent magnet that is adjacent to one of the first and second main surfaces of the magnetic memory chip, wherein:

the first portion is nearer the circuit board than the second portion, each of the first and second portions has a size larger than a size of the magnetic memory chip in the first direction, the first portion covers side surfaces of the magnetic memory chip in a second direction parallel to the first and second main surfaces and orthogonal to the first direction, and the first portion has first and second ends in the second direction, the second portion has third and fourth ends in the second direction, the first end and the third end face each other in a third direction orthogonal to the first and second directions, and the second end and the fourth end face each other in the third direction.

6. The device of claim 5, further comprising:

a spacer between the magnetic memory chip and the second portion, wherein the permanent magnet is provided on the first portion, and the magnetic memory chip is provided on the permanent magnet.

7. The device of claim 5, further comprising:

a spacer between the magnetic memory chip and the second portion, wherein the magnetic memory chip is provided on the first portion, and the permanent magnet is provided between the spacer and the second portion.

8. The device of claim 5, wherein the magnetic memory chip is provided on the first portion, and the permanent magnet is provided between the magnetic memory chip and the second portion.

9. A magnetic memory device comprising:

a magnetic memory chip having a magnetoresistive element;

a magnetic layer having first and second portions which are separated from each other so that there is a space between the first and second portions, the first portion covering a first main surface of the magnetic memory chip, and the second portion covering a second main surface of the magnetic memory chip opposite from the first main surface of the magnetic memory chip;

a circuit board on which the magnetic layer is mounted;

a bonding wire connecting between the magnetic memory chip and the circuit board in a first direction parallel to the first and second main surfaces; and a permanent magnet that is adjacent to one of the first and second main surfaces of the magnetic memory chip, wherein:

each of the first and second portions has a size larger than a size of the magnetic memory chip in the first direction, and the first portion has first and second ends in a second direction that is parallel to the first and second main surfaces and orthogonal to the first direction, the second portion has third and fourth ends in the second direction, the first end and the third end face each other in a third direction orthogonal to the first and second directions, and the second end and the fourth end face each other in the third direction.

* * * * *